(12) United States Patent
Kuratomi et al.

(10) Patent No.: US 7,445,969 B2
(45) Date of Patent: Nov. 4, 2008

(54) METHOD OF MANUFACTURING A SEMICONDUCTOR DEVICE

(75) Inventors: Bunshi Kuratomi, Kodaira (JP); Takafumi Nishita, Iruma (JP); Fukumi Shimizu, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/926,331

(22) Filed: Oct. 29, 2007

(65) Prior Publication Data

US 2008/0057626 A1 Mar. 6, 2008

Related U.S. Application Data

(63) Continuation of application No. 10/947,261, filed on Sep. 23, 2004, now Pat. No. 7,288,440.

(30) Foreign Application Priority Data

Sep. 26, 2003 (JP) ............................ 2003-334858

(51) Int. Cl.
*H01L 21/00* (2006.01)
(52) U.S. Cl. ...................... 438/126; 438/127
(58) Field of Classification Search ................ 438/112, 438/125, 126, 127
See application file for complete search history.

(56) References Cited

U.S. PATENT DOCUMENTS

| 5,798,070 A | 8/1998 | Sakai et al. |
| 5,894,006 A | 4/1999 | Herbst |
| 6,956,296 B2 | 10/2005 | Boyaud et al. |
| 2004/0048416 A1 | 3/2004 | Takase |
| 2006/0054901 A1 | 3/2006 | Shoji et al. |
| 2006/0198921 A1 | 9/2006 | Fujita |
| 2006/0223227 A1 | 10/2006 | Kubota et al. |

FOREIGN PATENT DOCUMENTS

| JP | 10-092853 | 4/1998 |
| JP | 2000-058571 | 2/2000 |
| JP | 2001-223229 | 8/2001 |

*Primary Examiner*—S. V Clark
(74) *Attorney, Agent, or Firm*—Antonelli, Terry, Stout & Kraus, LLP.

(57) ABSTRACT

For molding semiconductor chips on a wiring substrate matrix with a sealing resin, the wiring substrate matrix is placed on a lower die cavity block of a lower die, and, thereafter, an upper die is brought down, whereby an outer peripheral portion of a cavity of the upper die comes into abutment against an outer peripheral portion of a main surface of the wiring substrate matrix, causing the substrate matrix to be deformed a sufficient extent to prevent resin leakage. Thereafter, block pins provided on the upper die push down the lower die cavity block. Thus, when clamping the wiring substrate using both upper and lower dies, it is possible to suppress or prevent the application of excessive pressure to the wiring substrate matrix and to suppress or prevent deformation or cracking caused by crushing of the wiring substrate matrix. Consequently, the semiconductor device manufacturing yield can be improved.

3 Claims, 19 Drawing Sheets

METHOD OF MANUFACTURING A SEMICONDUCTOR DEVICE

CROSS-REFERENCE TO RELATED APPLICATION

The present application claims priority from Japanese patent application No. 2003-334858, filed on Sep. 26, 2003, the content of which is hereby incorporated by reference into this application. This application is a Continuation application of application Ser. No. 10/947,261, filed Sep. 23, 2004, now U.S. Pat. No. 7,288,440, the contents of which are incorporated herein by reference in their entirety.

BACKGROUND OF THE INVENTION

The present invention relates to a semiconductor device manufacturing technique. More particularly, the present invention is concerned with a molding technique for sealing electronic parts, such as semiconductor chips that are mounted on a wiring substrate, with a resin.

In a molding step included in a semiconductor device manufacturing process, a lead frame and a wiring substrate, having such electronic parts as semiconductor chips mounted thereon, are accommodated within a molding die, and then resin is injected into a cavity of the molding die to form a resin sealing member which covers and protects the electronic parts. In the case where the member which carries the electronic parts thereon is a lead frame, it is not so necessary to change the molding die because the thickness of the lead frame is almost constant. However, in the case where the electronic parts-carrying member is a wiring substrate, there is a tendency toward diversification of the type of member with adoption of a stacked structure of semiconductor chips and improvement of the packaging density; and, since the thickness of the resin sealing member and that of the wiring substrate may vary, there arises the necessity of changing the molding die accordingly. As to the case where the thickness of the resin sealing member differs, since this does not involve so many changes, a molding portion is newly fabricated to cope with production. However, the thickness of the wiring substrate differs for each type, and the range of thickness error is large due to the stacked structure of the wiring layers. Thus, it is impossible to take a satisfactory countermeasure to solve this dilemma. Therefore, even for similar products, it is necessary to fabricate a suitable molding die for each of the resin sealing members having different thicknesses. Further, it is necessary to provide molding dies to match the different thicknesses of the wiring substrates for different thicknesses of the resin sealing members. As a result, not only do new investment and product costs increase, but also the period required for the development of the product becomes longer. As a countermeasure, there is a known lower die elastic structure technique wherein a lower die of a molding die is supported vertically so as to be movable by means of an elastic member, such as a spring. According to this technique, in a molding step using the molding die, an upper surface of an outer peripheral edge of a wiring substrate placed on the lower die is held down by the upper die to sandwich the wiring substrate in between the upper and lower dies, and then resin is injected into a cavity of the molding die. In this case, since the lower die is supported vertically so as to be movable, when the wiring substrate is pushed down by the upper die, the lower die can be moved vertically in accordance with the thickness of the wiring substrate. Thus, a variation in thickness of the wiring substrate can be absorbed by the vertical movement of the lower die.

For example, Japanese Unexamined Patent Publication No. 2001-223229 discloses a construction wherein a wiring substrate block with a wiring substrate mounted thereon is supported vertically so as to be movable by a floating mechanism which utilizes a spring (see Patent Literature 1).

Also, for example, Japanese Unexamined Patent Publication No. 2000-58571 discloses a technique wherein a clamp block for pressing a substrate is provided in a molding die, and control is effected so as to exert an optimal pressing force of the clamp block against the substrate (see Patent Literature 2).

Further, for example, Japanese Unexamined Patent Publication No. Hei 10 (1998)-92853 discloses a technique wherein the degree of opening of each air vent is adjusted for suppressing the formation of voids or the like due to resin clogging of air vents in a molding die during sealing with resin (see Patent Literature 3).

[Patent Literature 1]
Japanese Unexamined Patent Publication No. 2001-223229
[Patent Literature 2]
Japanese Unexamined Patent Publication No. 2000-58571
[Patent Literature 3]
Japanese Unexamined Patent Publication No. Hei 10 (1998)-92853

SUMMARY OF THE INVENTION

The present inventors have found that the above-mentioned lower die elastic structure technique involves the following problems.

In the molding step, a large resin injection pressure of about 4.9 MPa (50 kg/cm$^2$) or more is applied to the wiring substrate surface. Therefore, in case of adopting the lower die elastic structure technique, it is necessary to set the elastic force of the elastic member of the lower die in the molding die at a high load of not lower than the resin injection pressure, preferably not lower than 49 MPa (500 kg/cm$^2$). In the foregoing lower die elastic structure technique, however, since the upper surface of the outer peripheral edge of the wiring substrate is pressed down directly by an outer peripheral portion of the upper die in the molding die, a high load induced by the elastic force from the lower die is applied to the pressing portion. Further, since the wiring substrate is formed of a soft material, such as a resist or copper foil, the wiring substrate is crushed to a greater extent than necessary prior to movement of the lower die. As a result, there arises the problem that the wiring substrate undergoes an excessive deformation or is cracked, or there arises the problem that the openings of air vents are blocked by the wiring substrate and become smaller, thus making it difficult to inject resin smoothly into the cavity. This problem is serious, particularly when a wiring substrate thicker than a predetermined thickness is accommodated within the molding die. On the other hand, if the elastic force of the lower die is weakened to such an extent as to not cause excessive deformation or cracking of the wiring substrate, the pressing pressure of both lower and upper dies against the wiring substrate becomes deficient, with consequent leakage of resin to the exterior of the cavity. This problem arises also when a wiring substrate that is thinner than a predetermined thickness is accommodated within the molding die. These problems lead to a lowering of the semiconductor device manufacturing yield.

It is an object of the present invention to provide a technique that makes it possible to improve the semiconductor device manufacturing yield.

The above and other objects and novel features of the present invention will become apparent from the following description and the accompanying drawings.

Typical modes of the present invention as disclosed herein will be outlined below.

In a molding step, when an upper die is moved down so as to sandwich a substrate placed on a lower die in between it and the lower die, an outer peripheral portion of a cavity in the upper die comes into abutment against the outer periphery of a main surface of the substrate, and, thereafter, projecting portions formed on a molding surface of the upper die come into direct contact with the lower die and push down the lower die, whereby the pressure applied to the substrate when held grippingly by both upper and lower dies can be relieved. Hence, it is possible to improve the semiconductor device manufacturing yield.

DETAILED DESCRIPTION OF THE PREFERRED EMBODIMENTS

Figure 1:
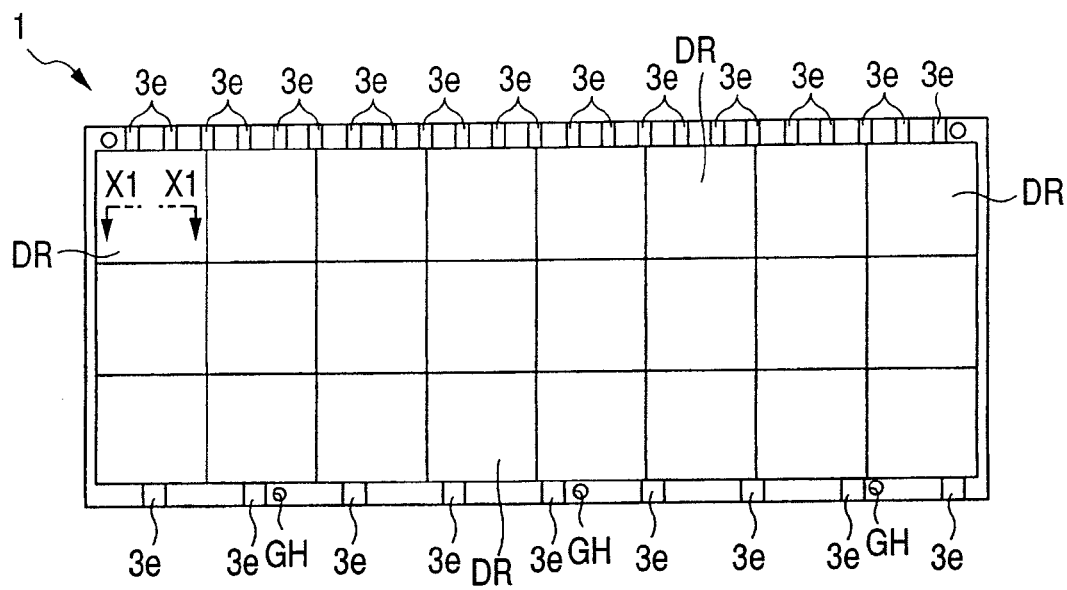
FIG. 1 is an overall plan view of a parts mounting surface of a wiring substrate matrix used in a semiconductor device manufacturing method embodying the present invention.

Where required for convenience' sake, in the following description, the subject matter of the invention may be presented in a divided manner in plural sections or embodiments, but unless otherwise mentioned, they are not unrelated to each other, but are in a relation such that one is a modification, a description of details, or a supplementary explanation, of part or the whole of the other. In the following description of the embodiments, when reference is made to a number of elements (including a number, numerical value, quantity, and range), no limitation is made to the number referred to, but values above and below the number referred to will do as well, unless otherwise mentioned and except in the case where it is basically evident that a limitation is made to the number referred to. Further, it goes without saying that, in the following description of the embodiments, the constituent elements (including constituent steps) are not always essential, unless otherwise mentioned, and except in the case where they are obviously considered basically essential. Likewise, it is to be understood that, when reference is made to the shapes and positional relation of components in the following description of the embodiments, those aspects substantially closely similar to or resembling such shapes, etc. are also included, unless otherwise mentioned, and except in the case where it is obvious that a negative answer basically results. This is also true of the foregoing numerical value and range. Moreover, in all of the drawings, portions having the same functions are identified by like reference numerals, and repeated explanations thereof will be omitted. Embodiments of the present invention will be described in detail hereinunder with reference to the accompanying drawings.

First Embodiment

In conjunction with this first embodiment, with reference to FIGS. 1 to 14, the description will be directed to a case where the present invention is applied to a semiconductor device manufacturing method of the MAO (Mold Array Package) type, in which, for example, plural semiconductor chips mounted on a wiring substrate are sealed all together.

Figure 2:
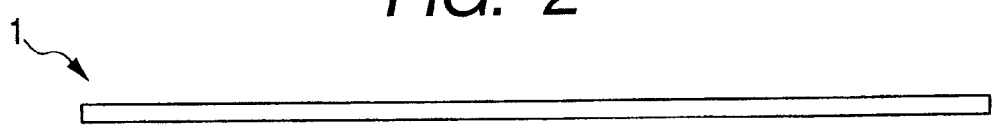
FIG. 2 is a side view of the structure shown in FIG. 1.
Figure 3:
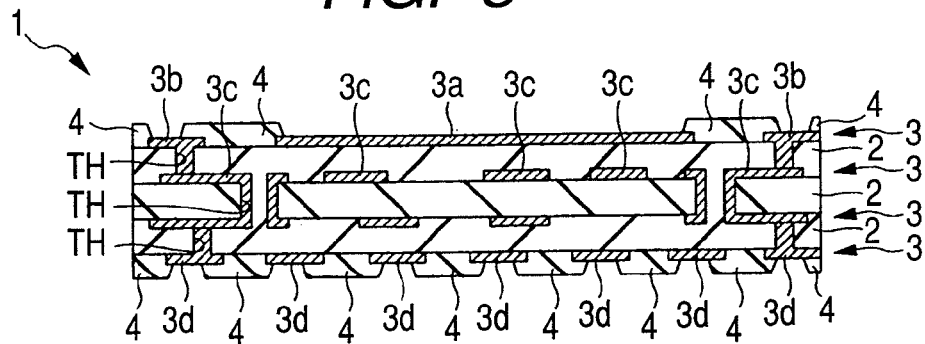
FIG. 3 is an enlarged sectional view taken on line X1-X1 in FIG. 1.

First, as shown in FIGS. 1 to 3, a wiring substrate matrix (hereinafter referred to as a "substrate matrix") 1 is provided. FIG. 1 is an overall plan view of a parts mounting surface of the substrate matrix 1, FIG. 2 is a side view thereof, and FIG. 3 is an enlarged sectional view taken on line X1-X1 in FIG. 1.

The substrate matrix 1 is a matrix of wiring substrates of semiconductor devices to be described later. Its appearance is like a thin plate which is rectangular as seen in plan view for example. The substrate matrix 1 has a main surface and a back surface on the side opposite to the main surface. As will be described later, the main surface of the substrate matrix 1 is a parts mounting surface for mounting semiconductor chips (simply "chips" hereinafter) thereon. The back surface of the substrate matrix 1 is a bump electrodes-forming surface on which bump electrodes are formed as will be described later. Product areas DR of the same size and shape are formed on the substrate matrix 1 adjacent to one another in vertical and transverse directions as seen in FIG. 1. Each product area DR is a unit area having a wiring substrate construction necessary for constituting one semiconductor device. Near one long side on an outer periphery of the substrate matrix 1, there are plural guide holes GH which extend through both the main surface and the back surface of the substrate matrix. Guide pins of a molding die to be described later are inserted into the guide holes GH, whereby the substrate matrix 1 can be placed on a lower die of the molding die in a state where the substrate matrix is aligned 1 with the lower die.

The substrate matrix 1 has a multi-layer wiring structure. A four-layer wiring structure is shown in FIG. 3. In FIG. 3, an upper surface of the substrate matrix 1 corresponds to the parts mounting surface, while a lower surface thereof corresponds to the bump electrodes-forming surface. The substrate matrix 1 includes a stack member formed by stacking insulating bases (cores) 2 and wiring layers 3 in an alternate manner, and solder resists 4 are applied to upper and lower surfaces (parts mounting surface and bump electrodes-forming surface) of the stack member.

The insulating bases 2 are formed of a highly heat-resistant glass fabric-based epoxy resin, for example. The material of the insulating bases 2 is not limited thereto, but various other materials are employable. For example, BT resin or aramid non-woven cloth may be used. If BT resin is selected as the material of the insulating bases 2, it is possible to improve the heat dissipating performance, because it is high in thermal conductivity.

Various conductor patterns 3a to 3e are formed in each wiring layer 3. The conductor patterns 3a to 3e are formed by etching copper (Cu) foil, for example. The conductor pattern 3a in the wiring layer 3 on the parts mounting surface is a chip mounting pattern. The conductor pattern 3b is an electrode pattern to which bonding wire is connected. The conductor pattern 3e is provided for facilitating peeling of a sealing resin to be described later. Conductor patterns for signal wiring and power supply wiring are also formed in the wiring layer 3 on the parts mounting surface. The conductor patterns 3a, 3b and 3e on the parts mounting surface are partially exposed from the solder resist 4 and the exposed surfaces are plated with, for example, nickel (Ni) and gold (Au). The conductor patterns 3d in the wiring layer 3 on the bump electrodes-forming surface are electrode patterns for the bonding of bump electrodes. Conductor patterns for signal wiring and power supply wiring are formed also on the bump electrodes-forming surface. The conductor patterns 3d on the bump electrodes-forming surface are also partially exposed from the solder resist 4, and the exposed surfaces are plated with, for example, nickel and gold. In the above-mentioned stack member, the conductor patterns 3c in the wiring layers 3 are wiring patterns for signals and power supply. The wiring layers 3 are electrically interconnected through a conductor (e.g., copper foil) formed within through holes TH.

The solder resist 4 is also called a solder mask or stop-off, and, in a soldering step, it functions as a protective film to prevent molten solder from contacting conductor patterns not to be soldered and to protect conductor patterns other than to-be-soldered portions from molten solder. The solder resist 4 also functions to prevent a solder bridge from forming between conductors, to protect the stack member from contamination and moisture, to prevent damage, to ensure environmental resistance, to prevent migration, to ensure insulation between circuits and to prevent creation of a short-circuit between circuits and other parts (e.g., chips and printed wiring boards). The solder resist 4 is made of a polyimide resin, for example, and it is formed in specific areas on the main surface and back surface of the substrate matrix 1.

Although reference is here made to a substrate matrix 1 having a four-layer wiring structure, no limitation is made thereto. In the molding step during manufacture of semiconductor devices, substrate matrices 1 of various wiring layer structures (various types), including a substrate matrix 1 of a two-layer wiring structure that is less than four layers and a substrate matrix 1 of a six-layer wiring structure that is more than four layers, arrive lot by lot. If the number of wiring layers (type) changes, the thickness of the substrate matrix 1 also changes (in the present situation, it changes in the range of about 210 to 1000 μm). Even in the case of substrate matrices 1 of a multi-layer wiring structure having the same number of wiring layers, they differ in thickness within a range of error (in the present situation, changes in the range of about ±30μ, for example). Particularly, there is a recent tendency to use a larger number of wiring layers, but the thickness error also becomes more and more conspicuous as the number of wiring layers increases. In the molding step, therefore, it is important to be able to use the same procedures to widely cope with changes in thickness of the substrate matrix 1.

Figure 4:
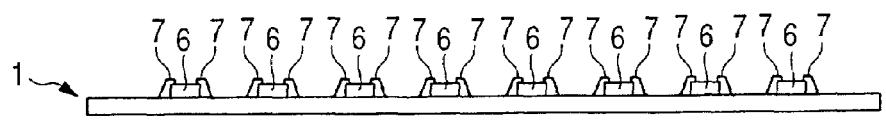
FIG. 4 is a side view of the wiring substrate matrix shown in FIG. 1 as it appears in a step of semiconductor device manufacturing process embodying the present invention.
Figure 5:
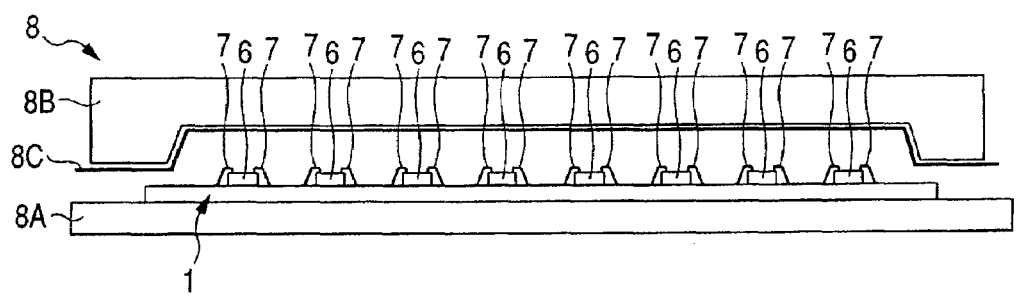
FIG. 5 is an explanatory diagram of a molding step for the semiconductor device which follows the step of FIG. 4.

Next, as shown in FIG. 4, which is a side view of the substrate matrix 1, chips 6 are mounted respectively in the product areas DR on the parts mounting surface of the substrate matrix 1 with use an adhesive, such as a paste containing silver, for example. Thereafter, for example with use of a known wire bonder, which utilizes both ultrasonic oscillation and thermo-compression bonding, bonding pads of the chips 6 and the conductor patterns 3b on the parts mounting surface of the substrate matrix 1 are electrically connected with each other through bonding wires 7 formed of gold, for example. Subsequently, as shown in FIG. 5, the substrate matrix 1, after the wire bonding step, is conveyed to a molding die 8. The molding die 8 illustrated in the figure comprises a lower die 8A, an upper die 8B, and a laminate film 8C. A cavity 8B1 of the upper die 8B forms an area corresponding to a sealing resin molding portion and is formed in such a size as to permit plural chips 6 to be sealed at a time on the substrate matrix 1. The laminate film 8C is a flexible insulating film that is high in thermal conductivity, e.g., a fluorine resin film, and it is interposed between the lower die 8A and the upper die 8B of the molding die 8. The laminate film C is about 50 μm in thickness and is formed in such a size as to cover substantially the whole of an inner wall surface of the cavity 8B1. The laminate film 8C can be wound up by a take-up reel. The molding die 8 and the resin molding method will be described in detail later.

A description will now be given of a molding step using the molding die 8. First, the substrate matrix 1 is placed on the lower die (first die) 8A of the molding die.

Figure 6:
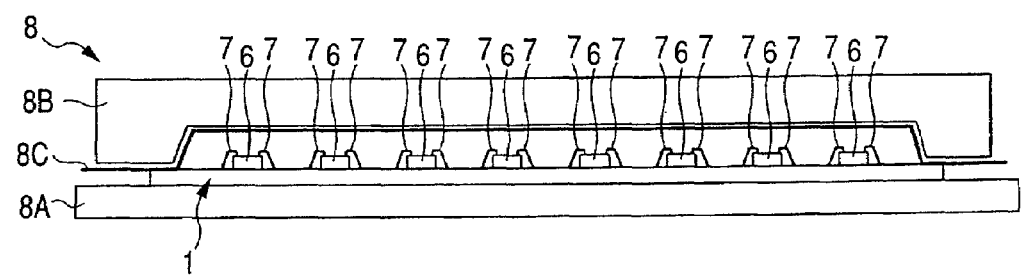
FIG. 6 is an explanatory diagram of the molding step which follows the step of FIG. 5.
Figure 7:
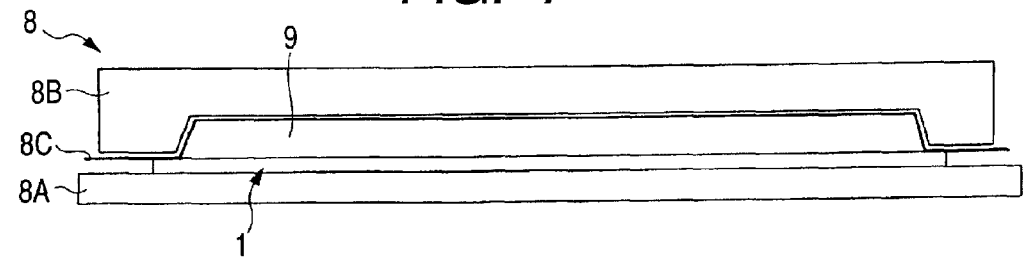
FIG. 7 is an explanatory diagram of the molding step which follows the step of FIG. 6.
Figure 8:
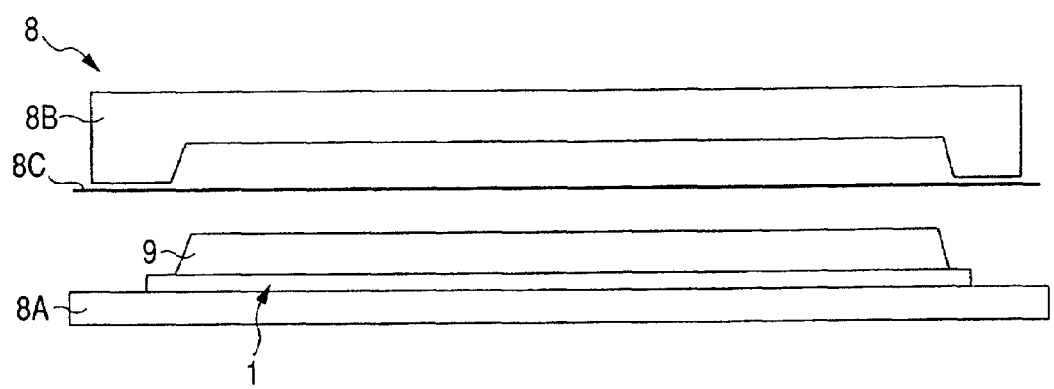
FIG. 8 is an explanatory diagram of the molding step which follows the step of FIG. 7.
Figure 9:
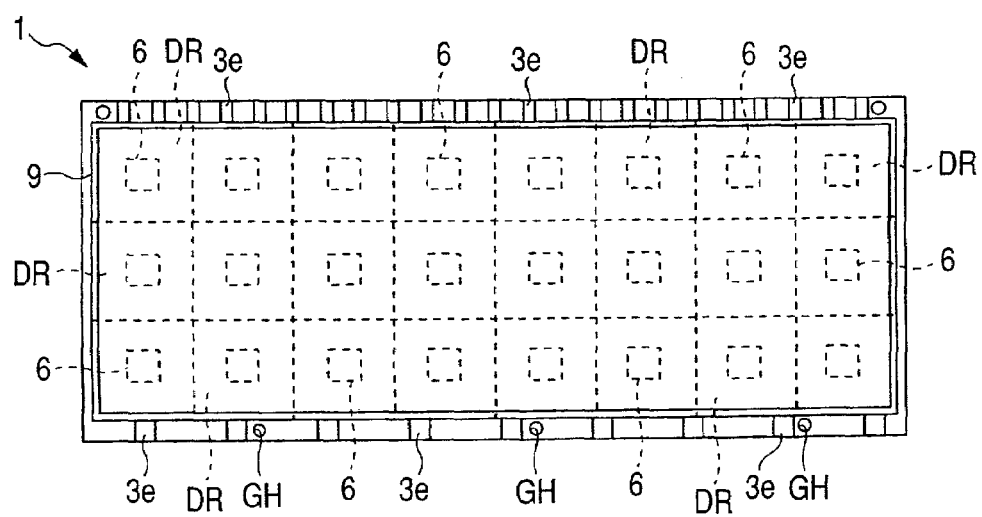
FIG. 9 is an overall plan view of the parts mounting surface of the wiring substrate matrix after the molding step shown in FIG. 8.

At this time, guide pins of the lower die 8A are inserted into the guide holes GH, whereby the substrate matrix 1 is placed on the lower die 8A in an aligned state with respect to the lower die. The temperature of the lower die 8A is set at, for example, about 175 to 180° C., and, at this temperature, the substrate matrix 1 is subjected to a preheat treatment for about 20 seconds. This treatment is performed for making thermal deformation of the substrate matrix 1 steady. Thereafter, while the temperature of the lower die 8A and the upper die (second die) 8B is at, for example, about 175 to 180° C., then the laminate film 8C is vacuum-sucked toward the upper die 8B into close contact with the upper die. Next, as shown in FIG. 6, the upper die 8B is brought down toward the lower die 8A to sandwich and hold the substrate matrix 1 between both upper and lower dies. At this time, an outer peripheral portion of the substrate matrix 1 is pushed against an outer peripheral portion of the cavity 8B1 of the upper die 8B through the laminate film 8C, resulting in about 5% of the total thickness of the substrate matrix 1 being crushed. Subsequently, while the above-referenced temperature and the vacuum suction for the laminate film 8C are maintained, a sealing resin, e.g., glass fabric-based epoxy resin, is injected into the cavity 8B1 of the upper die 8B to seal the plural chips 6 on the main surface of the substrate matrix 1 as well as the bonding wires at one time. As a result, as shown in FIG. 7, a block sealing member 9, which contains plural chips 6, is formed on the main surface of the substrate matrix 1. Thereafter, as shown in FIG. 8, while the lower die 8A is held at the above-referenced temperature, the vacuum suction for the laminate film 8C is stopped and the substrate matrix 1 after the molding step is taken out from the molding die 8 by utilizing the tension of the laminate film 8C. At this time, the laminate film 8C is interposed between the inner wall surface of the cavity 8B1 of the upper die 8B and the surface of the block sealing member 9, that is, the upper die 8B and the block sealing member 9 are not in direct contact with each other, and a force is applied not to individual points on the surface of the block sealing member 9, but to the whole of the surface of the block sealing member at the time of taking out the block sealing member from the cavity 8B1. Consequently, the block sealing member can be peeled from the upper die 8B with a relatively small force. Therefore, it is not necessary for the molding die 8 to be provided with an ejector pin for taking out the substrate matrix 1 after the molding step, and, hence, it is possible to simplify the construction of the molding die 8. Besides, it becomes possible to effectively utilize a surplus area for the ejector pin so far provided on the block sealing member 9. Moreover, it is possible to effect resin sealing in a large size because the releasability between the upper die 8B and the block sealing member can be improved. Further, since the frequency at which the interior of the molding die 8 is to be cleaned can be diminished, it also becomes possible to reduce the semiconductor device manufacturing cost. Of course, the semiconductor device manufacturing method of the present invention is applicable also to a molding die having a construction wherein the substrate matrix 1 after the molding step is released using an ejector pin without using the laminate film 8C. FIG. 9 is an overall plan view of the parts mounting surface side of the substrate matrix 1 after the above-described molding step. Although the figure illustrates a case where the block sealing member 9 has an integral construction, it is also possible to adopt a construction wherein the resin sealing is effected integrally column by column of the product areas Dr or for each product area DR. In these cases, portions where the block sealing member 9 is separated are present on the same substrate matrix 1.

Figure 10:
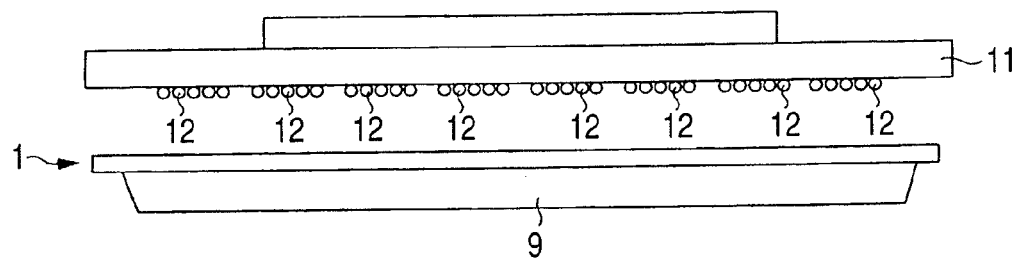
FIG. 10 is a diagram of a solder bump connecting step for the semiconductor device which follows the step of FIG. 9.
Figure 11:
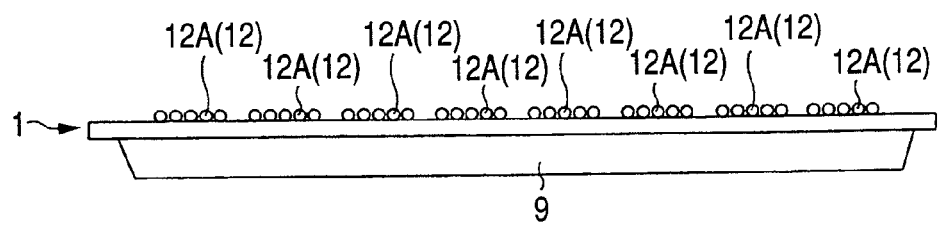
FIG. 11 is a diagram of the solder bump connecting step which follows the step of FIG. 10.

Next, as shown in FIG. 10, plural spherical solder bumps 12 held by a bump holding tool 11 are dipped in a flux vessel to apply flux to the surfaces of the solder bumps 12 and are then temporarily attached all together to the conductor patterns 3d on the bump electrodes-forming surface of the substrate matrix 1. The solder bumps 12 are formed of a lead (Pb)/tin (Sn) solder, for example. As the material of the solder bumps 12, a lead-free solder may be used, such as, for example, a tin/silver (Ag) solder. The solder bumps 12 may be connected product area DR by product area. However, from the standpoint of improving the throughput of the solder bump connecting step, it is preferable that the solder bumps 12 be connected for plural product areas DR at a time. Thereafter, the solder bumps 12 are subjected to heat-reflow at a temperature of, for example, 220° C. or so, and they are thereby fixed to the conductor patterns 3d to form bump electrodes 12A, as shown in FIG. 11. Thereafter, the residual flux remaining on the surface of the substrate matrix 1 is removed using a synthetic detergent or the like, whereby the solder bump connecting step is completed.

Figure 12:
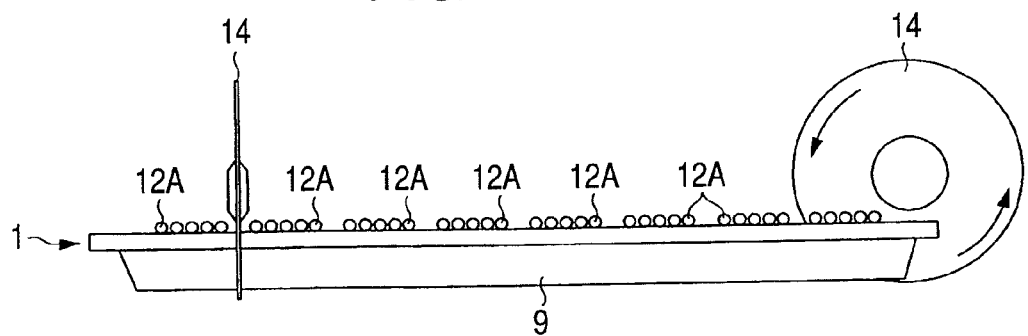
FIG. 12 is a diagram of a cutting step for the semiconductor device which follows the step of FIG. 11.
Figure 13:
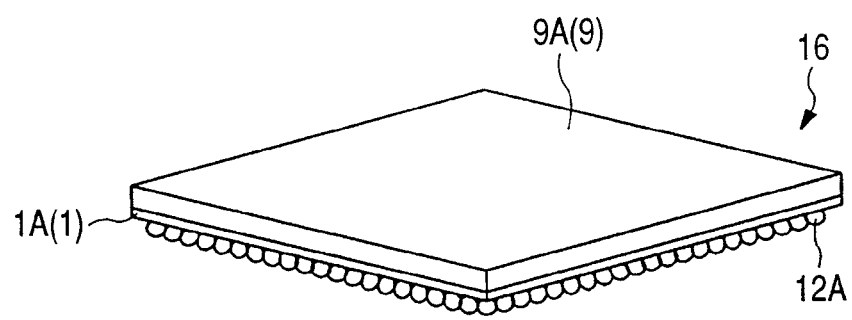
FIG. 13 is a perspective view of the semiconductor device embodying the present invention.
Figure 14:
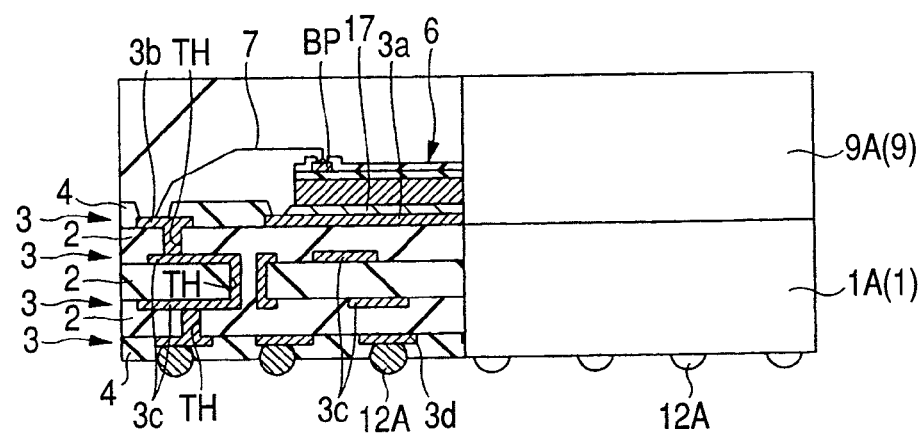
FIG. 14 is a partially cut-away side view of the semiconductor device shown in FIG. 13.

Next, as shown in FIG. 12, the substrate matrix 1 and the block sealing member 9 are cut using a dicing blade 14 from the back surface of the substrate matrix 1 as is the case with dicing a semiconductor wafer into chips 8. As a result, for example, plural CSPs (Chip Size Package) type semiconductor devices 16 are obtained at a time, as shown in FIGS. 13 and 14. FIG. 13 is a perspective view showing an example of the semiconductor device 16, and FIG. 14 is a partially cut-away side view of the semiconductor device shown in FIG. 13. A wiring substrate 1A is a member obtained by dicing the substrate matrix 1. With use of an adhesive 17, such as a silver-containing paste, a chip 6 is mounted on the conductor pattern 3a on the parts mounting surface of the wiring substrate 1A in a state in which the main surface thereof faces up. The bonding pads BP on the main surface of the chip 6 are electrically connected to the conductor patterns 3b on the parts mounting surface of the wiring substrate 1A through the bonding wires 7 described above. A sealing member 9A has been formed by molding on the parts mounting surface of the wiring substrate 1A. The chip 6 and the bonding wires 7 are sealed with the sealing member 9A. The sealing member 9A is a member obtained by dicing the block sealing member 9. On the other hand, bump electrodes 12A are connected to the conductor patterns 3d on the bump electrodes forming surface of the wiring substrate 1A. The conductor patterns 3a, etc. on the parts mounting surface are electrically connected to the conductor patterns 3d and the bump electrodes 12A on the bump electrodes forming surface through conductor patterns 3c and through holes TH formed in the wiring substrate 1A.

The following description is directed to a molding system having the molding die 8 described above.

Figure 15:
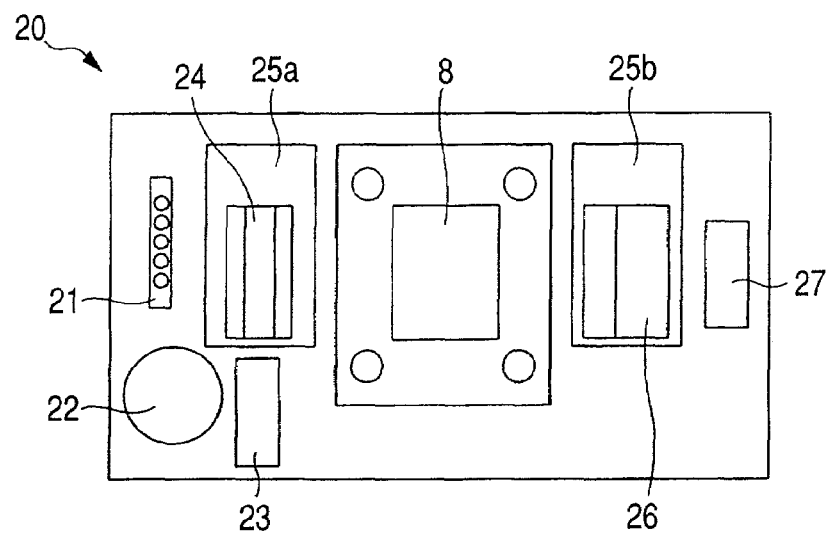
FIG. 15 is a diagram showing an example of an automatic molding system used in the semiconductor device manufacturing method embodying the present invention.

FIG. 15 is a diagram showing an example of an automatic molding system 20. The automatic molding system 20 includes a tablets aligning section 21, a tablet parts feeder 22, a substrate loader 23, a substrate aligning section 24, a load conveyance section 25a, a molding die 8, a gate break section 26, an unload conveyance section 25b, and an unloader 27. The substrate matrix 1 is received into the automatic molding system 20 through the substrate loader 23, then is aligned in the substrate aligning section 24, and is thereafter placed on the lower die of the molding die 8. After going through the molding step in the molding die 8, the substrate matrix 1 is conveyed to the gate break section 26, in which the resin remaining in the sealing resin inlet is removed, and then the substrate matrix 1 is conveyed to the unloader 27 through the unload conveyance section 25b and is taken out to the exterior.

A description will now be given of the molding die 8 in the automatic molding system 20.

Figure 16:
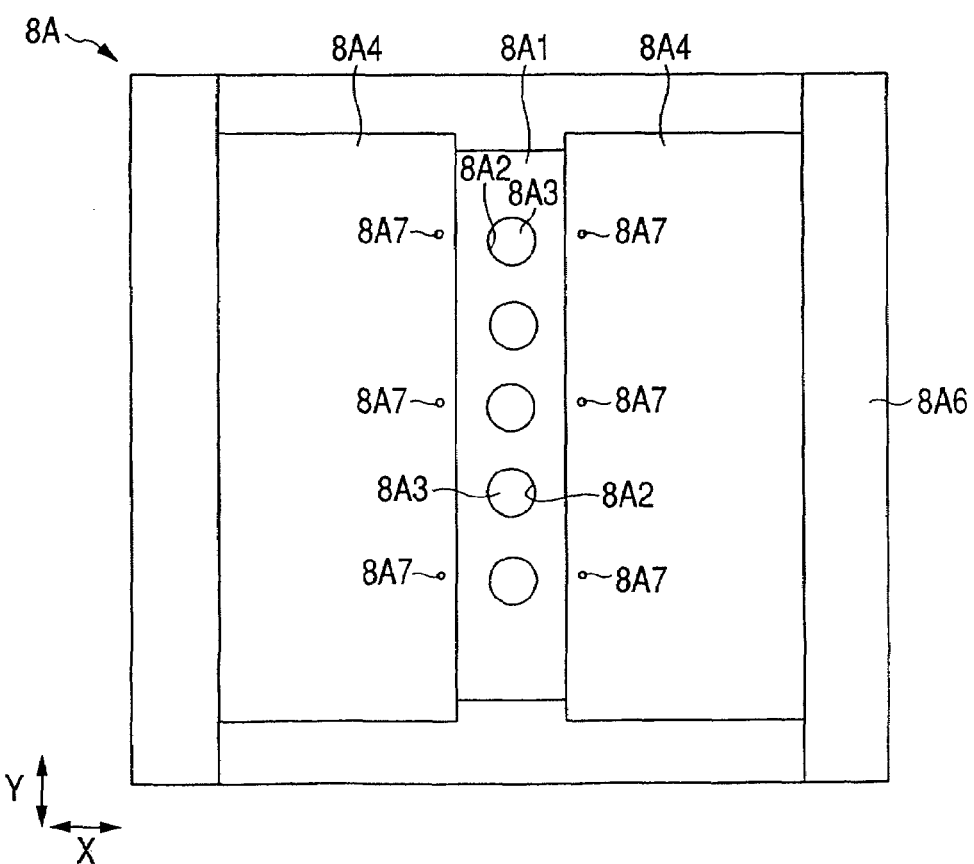
FIG. 16 is a plan view of a molding surface of a lower die of a molding die in the automatic molding system shown in FIG. 15.
Figure 17:
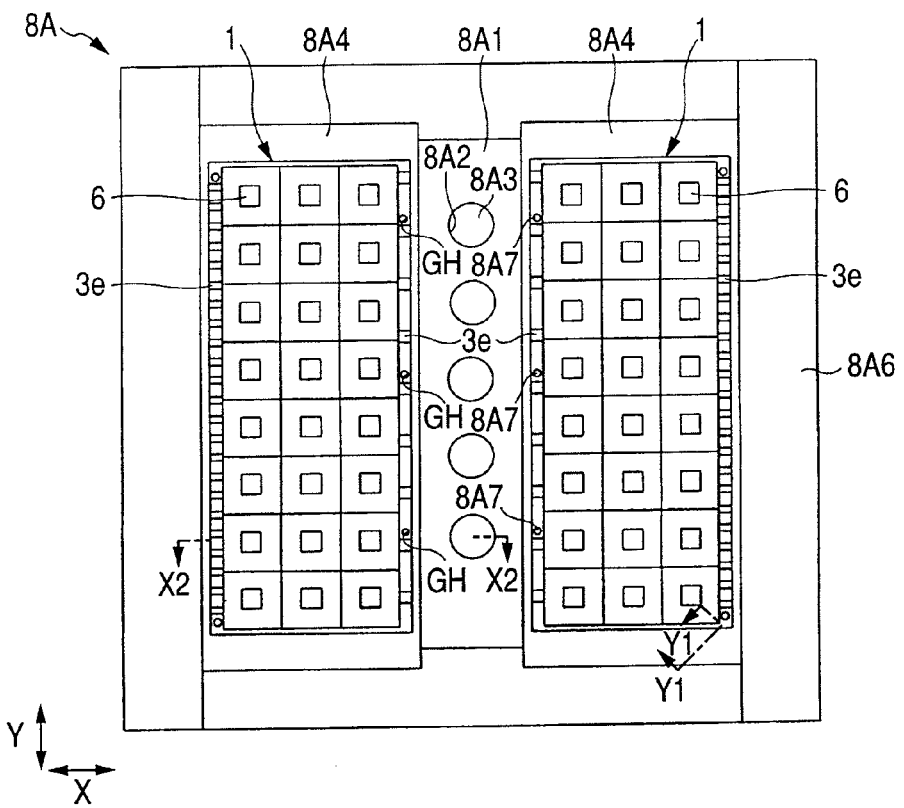
FIG. 17 is a plan view of the molding surface, showing a mounted state of the wiring substrate matrices on the lower die illustrated in FIG. 16.
Figure 18:
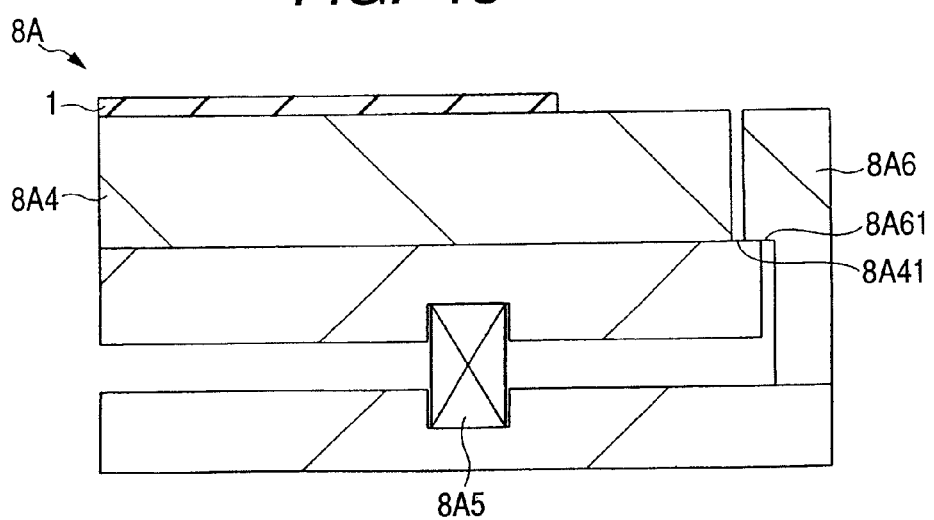
FIG. 18 is a sectional view taken on line Y1-Y1 in FIG. 17.
Figure 19:
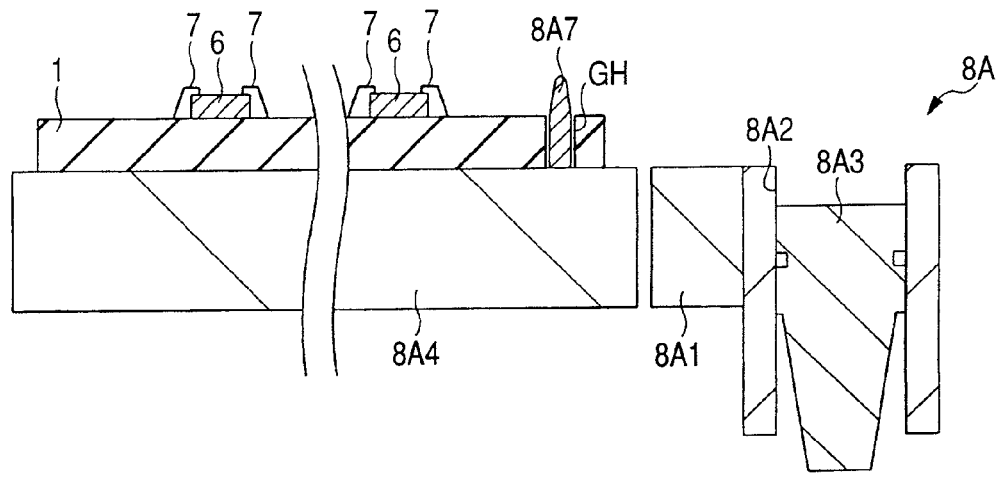
FIG. 19 is a sectional view taken on lien X2-X2 in FIG. 17.

Reference will first be made to a lower die 8A. FIG. 16 is a plan view of a molding surface of the lower mold 8A; FIG. 17 is a plan view of the molding surface, showing a state in which the substrate matrix 1 is placed on the lower die 8A shown in FIG. 16; FIG. 18 is a sectional view taken on line Y1-Y1 in FIG. 17; and FIG. 19 is a sectional view taken on line X2-X2 in FIG. 17. The reference marks X and Y represent first and second directions, respectively.

A pot holder 8A1 is disposed centrally in the first direction X (transverse direction in FIGS. 16 and 17) of the molding surface (the surface opposed to an upper die 8B) of the lower die 8A. Plural pots 8A2 are arranged side by side in the second direction Y (vertical direction in FIGS. 16 and 17) on the pot holder 8A1. The pots 8A2 are molding material feed ports, and a plunger 8A3 is disposed in each pot 8A2. The plunger 8A3 is a constituent part used for injecting the molding material from the interior of the pot 8A2 into a cavity 8B1 of the upper die 8B and holding it in a pressurized state. A low plunger is illustrated in the drawing.

Lower die cavity blocks 8A4 are disposed on both right and left sides of the pot holder 8A1, which is positioned centrally of the molding surface of the lower die 8A. Thus, in the illustrated example, the molding die 8 can effect molding for two substrate matrices 1 in one molding step. On the back side (the side opposite to the molding surface) of each lower die cavity block 8A4, there is disposed an elastic member 8A5, such as, for example, a coiled spring or a plate spring. By virtue of the elasticity of the elastic member 8A5 the lower die cavity block 8A4 can move vertically in FIGS. 18 and 19. In order to withstand a resin injection pressure (about 4.9 MPa (50 kg/cm$^2$) or higher), the elastic member 8A5 possesses an elastic force of a high load which is at least equal to the resin injection pressure, preferably 49 MPa (500 kg/cm$^2$) or higher. A lower portion of the lower die cavity block 8A4 is formed somewhat larger in diameter, and a stepped portion 8A41 in the larger-diameter portion comes into abutment against a stepped portion 8A61 of a base 8A6 of the molding die 8A, whereby the lower die cavity block 8A4 is prevented from moving upward, as seen in FIGS. 18 and 19. On an upper surface (molding surface) of the lower die cavity block 8A4, plural guide pins 8A7 are provided along a long side of the upper surface at positions near the center and near the long side. As described above, positioning of the substrate matrix 1 is performed by insertion of the guide pins 8A7 into the guide holes GH formed in the substrate matrix 1.

Figure 20:
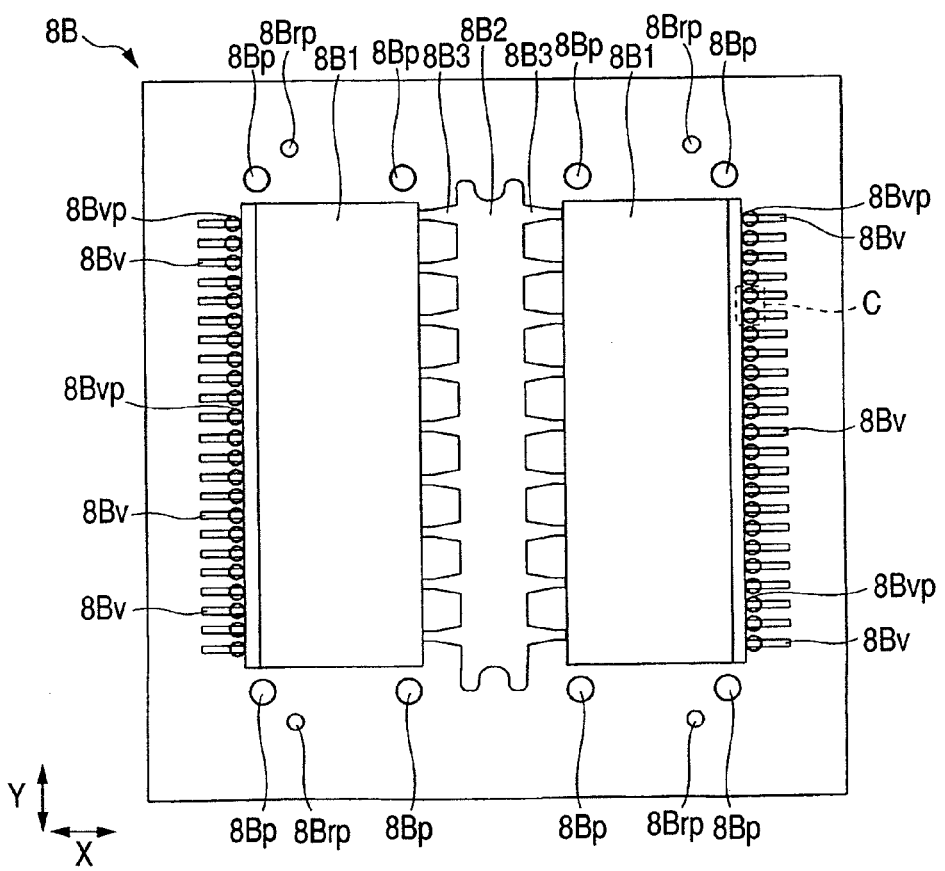
FIG. 20 is a plan view of a molding surface of an upper die of the molding die used in the semiconductor manufacturing process embodying the present invention.
Figure 21:
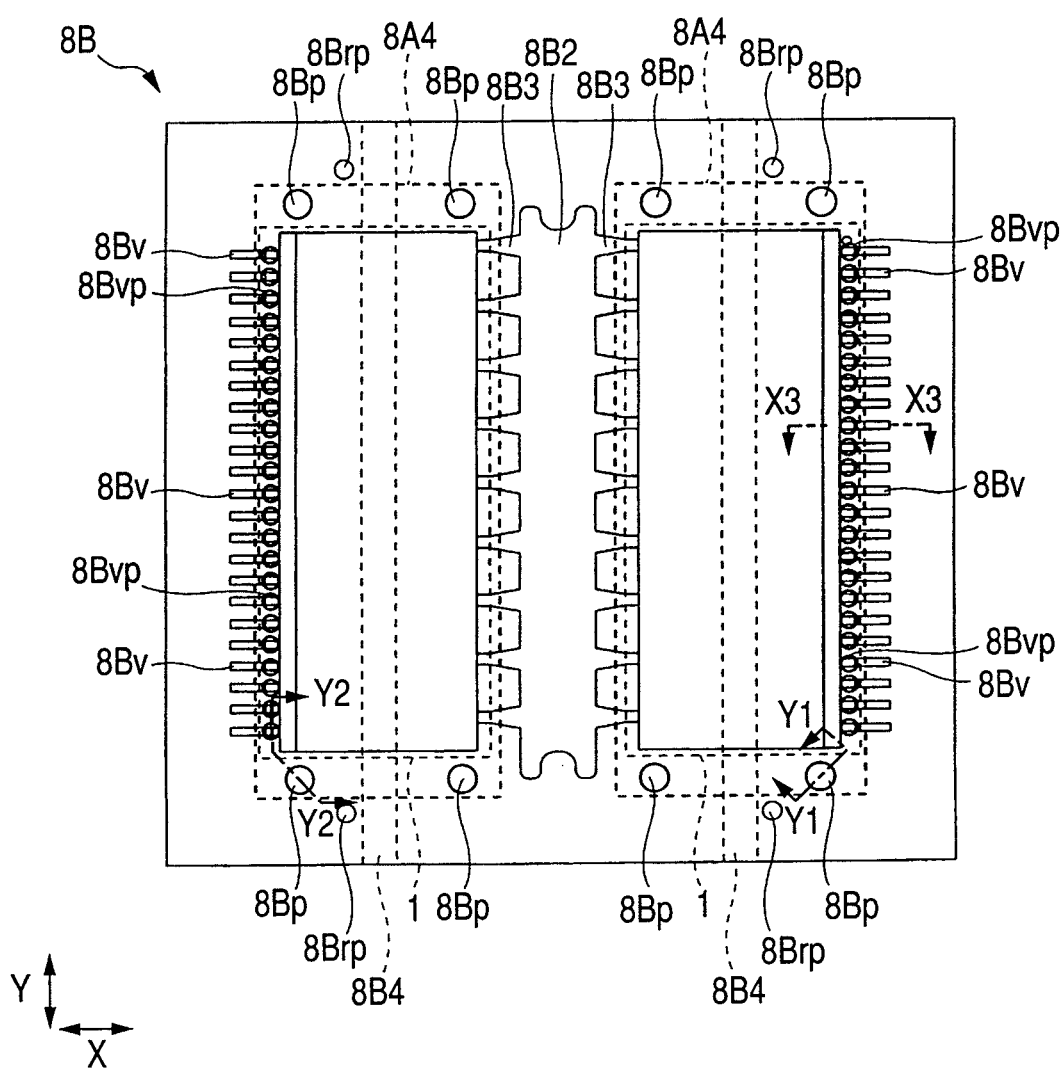
FIG. 21 is a plan view of the molding surface of the upper die illustrated in FIG. 20, showing cavity blocks of the lower die and the wiring substrate matrices superimposed on the upper die of FIG. 20.
Figure 22:
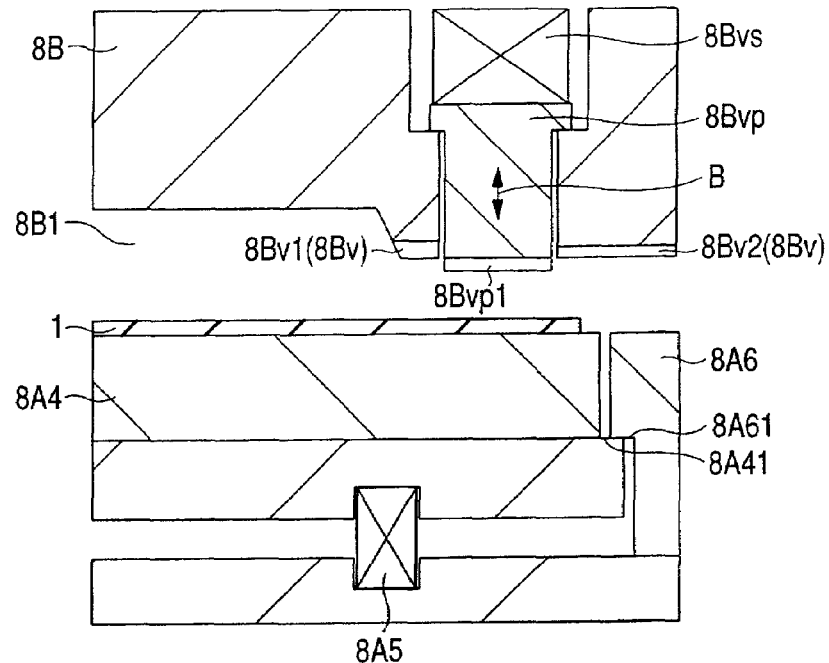
FIG. 22 is a sectional view taken on line X3-X3 in FIG. 21.
Figure 23:
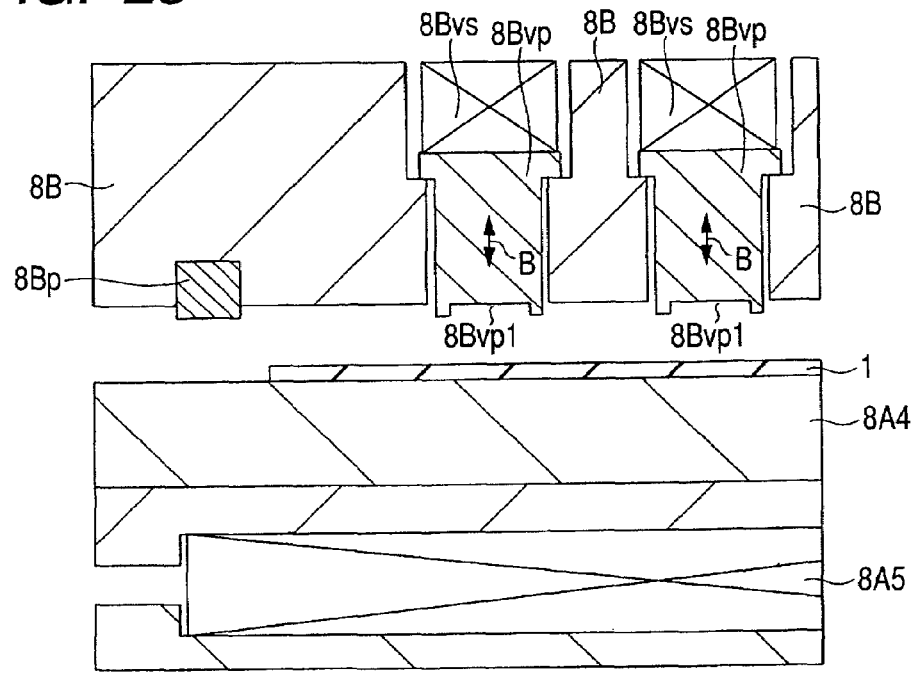
FIG. 23 is a sectional view taken on line Y2-Y2 in FIG. 21.
Figure 24:
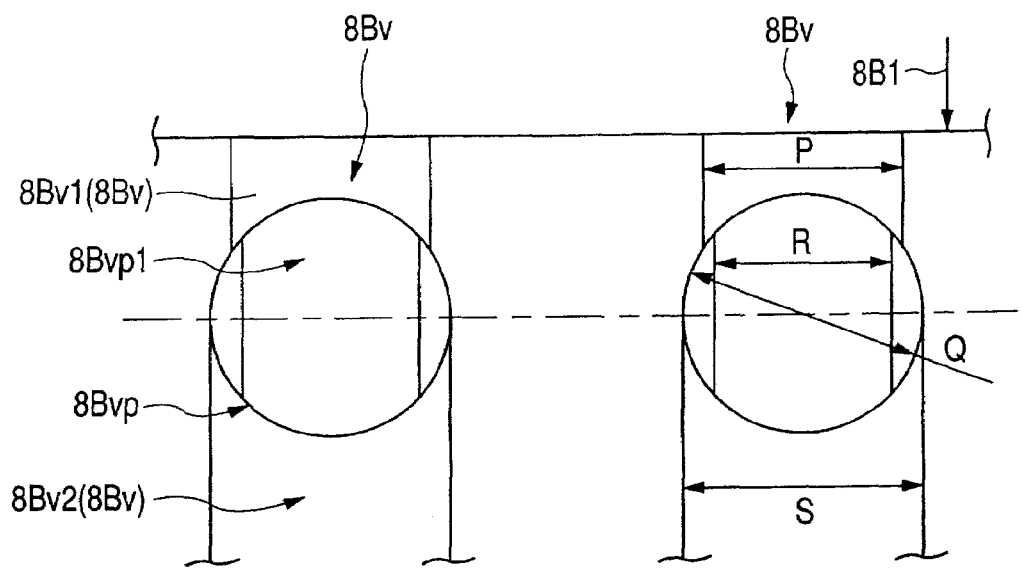
FIG. 24 is an enlarged diagrammatic plan view of area C in FIG. 20.
Figure 25:
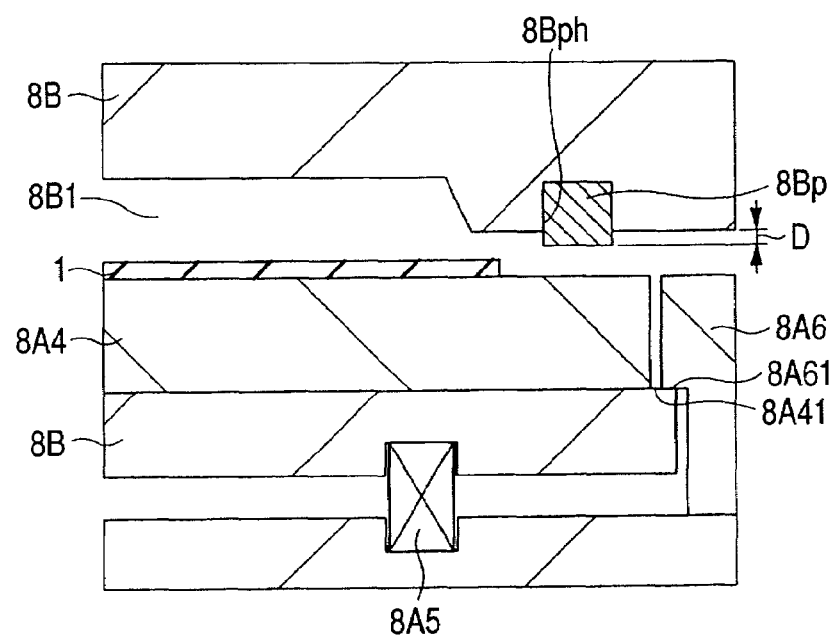
FIG. 25 is a sectional view taken on line Y1-Y1 in FIG. 21.
Figure 26:
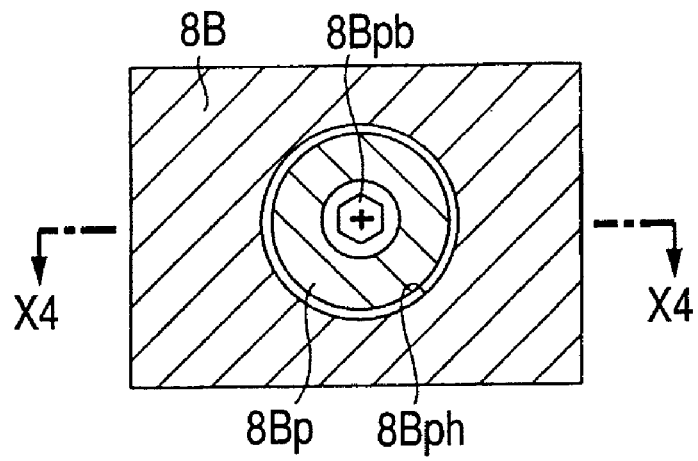
FIG. 26 is an enlarged plan view of a principal portion of the upper die, showing a block pin illustrated in FIGS. 20, 21, 23 and 25 and the vicinity thereof.
Figure 27:
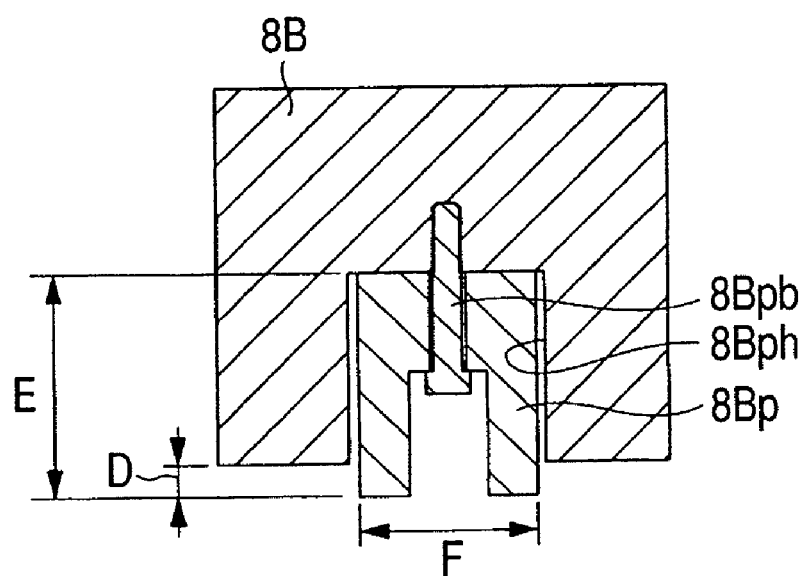
FIG. 27 is a sectional view taken on line X4-X4 in FIG. 26.

Next, reference will be made to the upper die 8B. FIG. 20 is a plan view of a molding surface of the upper die 8B; FIG. 21 is a plan view of the molding surface, showing the lower die cavity blocks 8A4 of the lower die 8A and the substrate matrices 1 in a superimposed state on the upper die 8B illustrated in FIG. 20; FIG. 22 is a sectional view taken on line X3-X3 in FIG. 21; FIG. 23 is a sectional view taken on line Y2-Y2; FIG. 24 is an enlarged plan view of an area C in FIG. 20; FIG. 25 is a sectional view taken on line Y1-Y1 in FIG. 21; FIG. 26 is an enlarged plan view of a principal portion, showing a block pin 8Bp and the vicinity thereof; and FIG. 27 is a sectional view taken on line X4-X4. A first direction X and a second direction Y in FIGS. 20 and 21 correspond respectively to the first direction X and the second direction Y in FIGS. 16 and 17. Although FIG. 26 is a plan view, it is hatched to make it easier to see.

A groove 8B2 for culls and runners is formed centrally in the first direction X (transverse direction in FIGS. 20 and 21) of the molding surface (the surface opposed to the lower die 8A) of the upper die 8B at a position opposed to the pot holder 8A1. The groove 8B2 extends in the second direction Y (vertical direction in FIGS. 20 and 21). Plural gates 8B3 are formed from both long sides of the groove 8B2 toward one long side of the cavities 8B1 disposed on both right and left sides of the groove 8B2, the gates 8B3 extending so as to connect the groove 8B2 and the cavities 8B1 with each other. The gates 8B3 are inlets through which molten resin for sealing, flowing from the groove 8B2, is allowed to enter the cavities 8B1.

Plural air vents 8Bv extend outward (in a direction away from the cavity 8B1) from the other long side of each cavity 8B1. The air vents 8Bv are grooves for sending out air to the exterior from a resin-filled portion during injection of the sealing resin into the cavity 8B1. Since the air vents 8Bv are thus arranged plurally, even if the state (for example, the state of unevenness caused by wiring) of the main surface of the substrate matrix 1 differs at various positions, the air vents 8Bv can be made constant in depth at the various positions irrespective of such difference. Consequently, the air present in the resin-filled portion can be sent out smoothly to the exterior during injection of the sealing resin, thus permitting the sealing resin to be injected into the cavity in a satisfactory manner.

A movable pin 8Bvp is disposed in the passage of each air vent 8Bv. Before closing of the molding die 8, a lower end portion of the movable pin 8Bvp projects into the associated air vent 8Bv. A groove 8Bvp1 is formed in a lower end face of the movable pin 8Bvp. The groove 8Bvp1 forms a part of the passage of the air vent 8Bv.

An elastic member 8Bvs, such as, for example, a coiled spring or a plate spring, is installed on an upper end face (opposite to the lower end face) of each movable pin 8Bvp.

Therefore, when the molding die 8 is closed and each substrate matrix 1 is held so as to be sandwiched between the lower die 8A and the upper die 8B, the movable pins 8Bvp are pushed by the main surface of the substrate matrix 1 and move toward the upper die 8B, so that the elastic members 8Bvs on the movable pins 8Bvp are compressed, while the lower end faces of the movable pins 8Bvp press down the main surface of the substrate matrix 1 with a repulsive force exerted from the elastic members 8Bvs. As a result, even if variations in the thickness of the substrate matrix 1 occur, or even if concave and convex areas are formed due to wiring (conductor patterns) on the main surface (parts mounting surface) of the substrate matrix 1, the lower end faces of the movable pins 8Bvp projecting into the air vents 8Bv come into close contact with the substrate matrix 1 so as to automatically match the state of the main surface of the substrate matrix 1 at various positions of the main surface when the substrate matrix is clamped by the molding die 8. At this time, even if the stop position in the vertical direction of each movable pin 8Bvp differs depending on variations in thickness of the substrate matrix 1, or depending on the state of the main surface, the depth of each air vent 8Bv can be made constant automatically if the depth of the groove 8Bvp1 formed in the lower end face of each movable pin 8Bvp is constant, so that the air present in the resin-filled portion can be sent out smoothly during injection of the sealing resin, and, hence, the sealing resin can be injected into each cavity 8B1 in a satisfactory manner.

In the molding step, since the resin injection pressure is not directly applied to the air vents 8Bv, the elastic force of the elastic member 8Bvs against the movable pins 8Bvp may be at such a degree of load that the substrate matrix 1 is pushed lightly. Preferably, the elastic force of the elastic member 8Bvs is much smaller than the clamping pressure (e.g., 49 MPa (500 kg/cm$^2$)) of the molding die 8 for the substrate matrix 1, is such a degree of pressure as to not cause deformation or damage to the substrate matrix 1, but can still prevent leakage of resin, and is higher than the resin injection pressure. More specifically, the load in question is, for example, 6.86 MPa (70 kg/cm$^2$) or so. Further, the elastic force of the elastic member 8Bvs is set so that a movable quantity B of each movable pin 8Bvp is about 100 to 200 μm, for example. The numeral 8Brp denotes a return pin for air vent movement.

Next, a description will be provided concerning the depth of each air vent 8Bv. Each air vent 8Bv can be sectioned into four portions, which include a movable pin front portion 8Bv1, a movable pin portion (or an air vent main portion, corresponding to each groove 8Bvp1), a movable pin rear portion 8Bv2, and an open portion, along a flow path from the associated cavity 8B1. The movable pin front portion 8Bv1 will now be described. If the tolerance in thickness of the substrate matrix 1 is assumed to be, for example, ±30 μm, then, even in the case, where the substrate matrix is the thickest, it is possible to ensure an effective depth of each air vent 8Bv of about 30 to 40 μm if the depth is set at 60 to 70 μm. In case of using the laminate film 8C, the depth is a measure not from the surface of the upper die 8B, but from a lower surface of the laminate film 8C (it goes without saying that the depth is measured from the surface of the upper die 8B if the laminate film 8C is not used). Therefore, if the normal thickness of the laminate film 8C is about 50 μm, then in the molding step the actual thickness is presumed to be about 30 μm as a result of elongation. As a result, in the molding step using the laminate film 8C, the mechanical cut depth for the air vent becomes the sum of the above-mentioned value and the actual thickness of the laminate film 8C. In the above movable pin portion, this value is ensured automatically by setting the cut depth at 40 to 50 μm. For the movable pin rear portion 8Bv2, it suffices to set the depth at 50 to 60 μm. This is because the movable pin rear portion 8Bv2 is immediately contiguous to the open portion having a depth of about 150 μm.

Thus, as described above, by making the effective depth of the main portion of the air vent 8Bv constant irrespective of the thickness of the substrate matrix 1 (including the lead frame), it is possible to prevent the leakage of resin effectively without making the clamping force of the molding die 8 excessively strong (in the above example, a load of up to 5000 kgw is applied for one substrate matrix 1, thereby causing the substrate matrix to be deformed to excess). In the case where the substrate matrix 1 is thin in the negative direction of the tolerance, the leakage of resin is apt to occur. However, in the molding die 8 used in this first embodiment, since the movable pins 8Bvp are pressed down lightly with the elastic force of the elastic members 8Bvs and are not directly influenced by the resin injection pressure, the leakage of resin from the air vents 8Bv can be blocked.

In the molding die 8 used in this first embodiment, the depth of the movable pin front portion 8Bv of each air vent 8Bv and that of the movable pin rear portion 8Bv2 are different, the former being larger than the latter. More particularly, the depth of the movable pin front portion 8Bv1 is set at, for example, 70 to 80 μm, while that of the movable pin rear portion 8Bv2 is set at, for example, 50 to 60 μm. By thus making the movable pin front portion 8Bv1 deeper, even when the depth of the substrate matrix 1 varies, there is no fear of the air vent 8Bv being blocked by such variation. That is, the area of each air vent 8Bv can be ensured positively.

A description will now be given about the width of each air vent 8Bv. In this first embodiment, as shown in FIG. 24, the vent width P of the movable pin front portion 8Bv1 of the air vent 8Bv is smaller than the diameter Q of the movable pin 8Bvp. Preferably, the diameter Q of the movable pin 8Bvp is set at, for example, 5 mm or so, the width P of the movable pin front portion 8Bv1 is set at, for example, 4 mm or so, the vent width S of the movable pin rear portion 8Bv2 is set at, for example, 5 mm or so, and the width R of the groove 8Bvp1 formed in the lower end face of each movable pin 8Bp is set at, for example, 2 to 3 mm or so. By so setting these values, even in the case where the substrate matrix 1 is formed thin in the negative direction of its thickness tolerance, the leakage of the sealing resin can be blocked by the movable pins 8Bvp and thus can be prevented positively.

In the molding die 8 used in this first embodiment, block pins 8Bp are installed in a removable state near the four corners of the outer peripheral portion of each cavity 8B1 on the molding surface of the upper die 8B and at positions deviated from the profile of the substrate matrix 1. The block pins 8Bp, when seen in section, are projected a little from the molding surface of the outer peripheral portion of each cavity in the upper die 8B in a direction orthogonal to the molding surface. In the molding step, the molding surface of the outer peripheral portion of each cavity 8B1 in the upper die 8B comes into abutment against the outer periphery of the main surface (parts mounting surface) of the substrate matrix 1 and causes the substrate matrix 1 to be deformed sufficiently to the extent that resin leakage is prevented, thereafter, it pushes down each lower die cavity block 8A4 in the lower die 8A. By so doing, the substrate matrix 1 can be suppressed or prevented from being excessively pressurized when clamped by both the upper die 8B and the lower die 8A in the molding step, and, hence, it is possible to suppress or prevent the substrate matrix 1 from being deformed or cracked due to crushing thereof.

The amount of deformation of the main surface of the substrate matrix 1 caused by the molding surface of the outer peripheral portion of each cavity 8B1 is, for example, 30 to 40 μm.

The block pins 8Bp are inserted into guide holes 8Bph opened in the upper die 8B, and, in this state. they are firmly fastened with bolts 8Bpb, removably. The reason why the block pins 8Bp are made removable is that the projection length (projecting length from the molding surface of the upper die 8B) D of each block pin 8Bp must be changed in accordance with the thickness of the substrate matrix 1, as well as the fact that the block pins need to be removed, periodically for maintenance and replacement. The projection length D of each block pin 8Bp from the molding surface of the upper die 8B which comes into contact with the substrate matrix 1 is set from the standpoint of ensuring an appropriate amount of deformation of the substrate matrix 1. For example, when the thickness of the substrate matrix 1 is 0.3 mm, a deformation quantity of 0.03 mm of the substrate matrix 1 can be ensured by setting the projection length D at 0.27 mm. The overall length E of each block pin 8Bp is, for example, 15 mm or so. The material of the block pins 8Bp is a highly abrasion-resistant metal, such as, for example, SKS or SKH. In this first embodiment, the block pins 8Bp are formed of the same metallic material as the upper die 8B, whereby it is possible to improve the thermal stability.

The planar shape (the shape of the pressing surface) of each block pin 8Bp is circular, for example. By making the planar shape of each block pin 8Bp circular, it is possible to facilitate machining of the guide holes 8Bph and the block pin 8Bp itself, and a reduction of the cost can also be attained. Moreover, it is possible to enhance the strength of each block pin 8Bp, and, hence, it is possible to make the block pin difficult to be crushed. The planar diameter of each block pin 8 Bp is, for example, 8 to 10 mm or so. The block pins 8Bp are arranged so as to be symmetric vertically and transversely for each cavity 8B1, whereby it is possible to equalize the pressing force from the block pins 8Bp to each lower die cavity block 8A4. In the case of block pins 8Bp that are circular as seen in plan view (the pressing surface), it is preferable that the number of the block pins be four or so for each cavity 8B1. This is proposed for the following reason.

If an extremely large number of block pins 8Bp are arranged, a large number of guide holes 8Bph are formed in the upper die 8B. As a result, there arise a fear that the mechanical strength of the upper die 8B may be impaired with consequent occurrence of twist or the like and a lowering in accuracy of the molding die. Moreover, since the upper die 8B is equipped with other components, such as heaters 8B4, care must be exercised to avoid interference with such other components. Further, if the number of block pins 8Bp is very large, there is a fear that landing points of the block pins 8Bp may become less stable. As the case may be, the heaters 8B4 are not installed in the upper die 8B.

Figure 28:
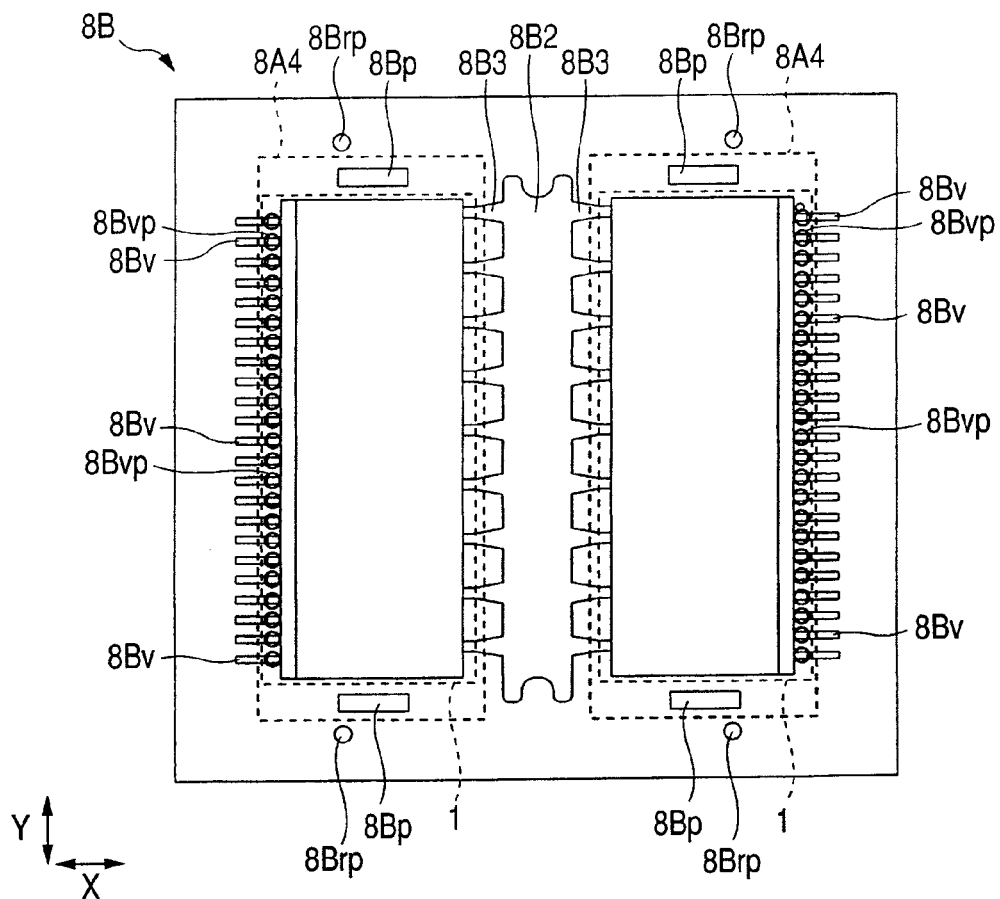
FIG. 28 is a plan view of the molding surface of the upper die, showing cavity blocks of the lower die and the wiring substrate matrices superimposed on the upper die.
Figure 29:
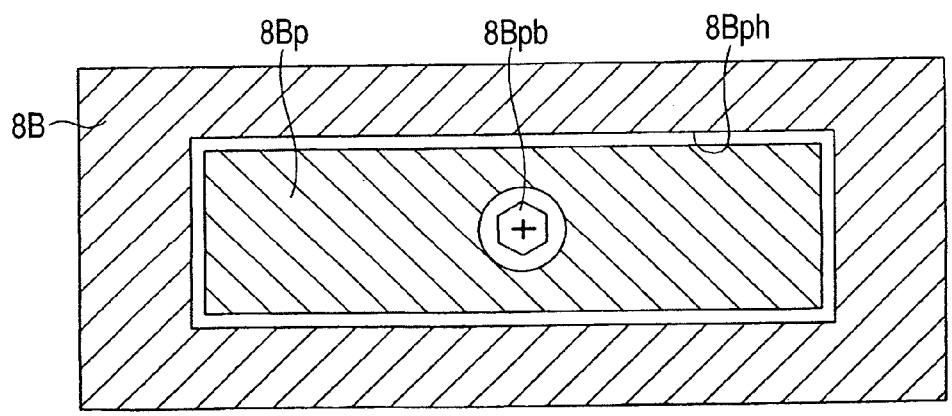
FIG. 29 is an enlarged plan view of a principal portion of the upper die, showing a block pin illustrated in FIG. 28 and the vicinity thereof.

As a modified shape of the block pins 8Bp, as shown in FIGS. 28 and 29, a shape may be adopted whose aspect ratio is not 1:1, such as a rectangular shape as seen in plan view (the pressing surface). In this case, the number of parts and hence, the cost can be reduced because it suffices to arrange about two such rectangular block pins for each cavity 8B1.

FIG. 28 is a plan view of the molding surface, showing the lower die cavity block 8A4 of the lower die 8A and the substrate matrix 1 in a superimposed state on the upper die 8B, and FIG. 29 is an enlarged plan view of a principal portion, showing a block pin 8Bp illustrated in FIG. 28 and the vicinity thereof. First and second directions X, Y in FIG. 28 correspond to the first and second directions X, Y, respectively, in FIGS. 16 and 17. A sectional view of FIG. 29 is omitted because it is the same as FIG. 27, except for the size.

An example of a molding step using the molding die 8 will be described below.

Figure 30:
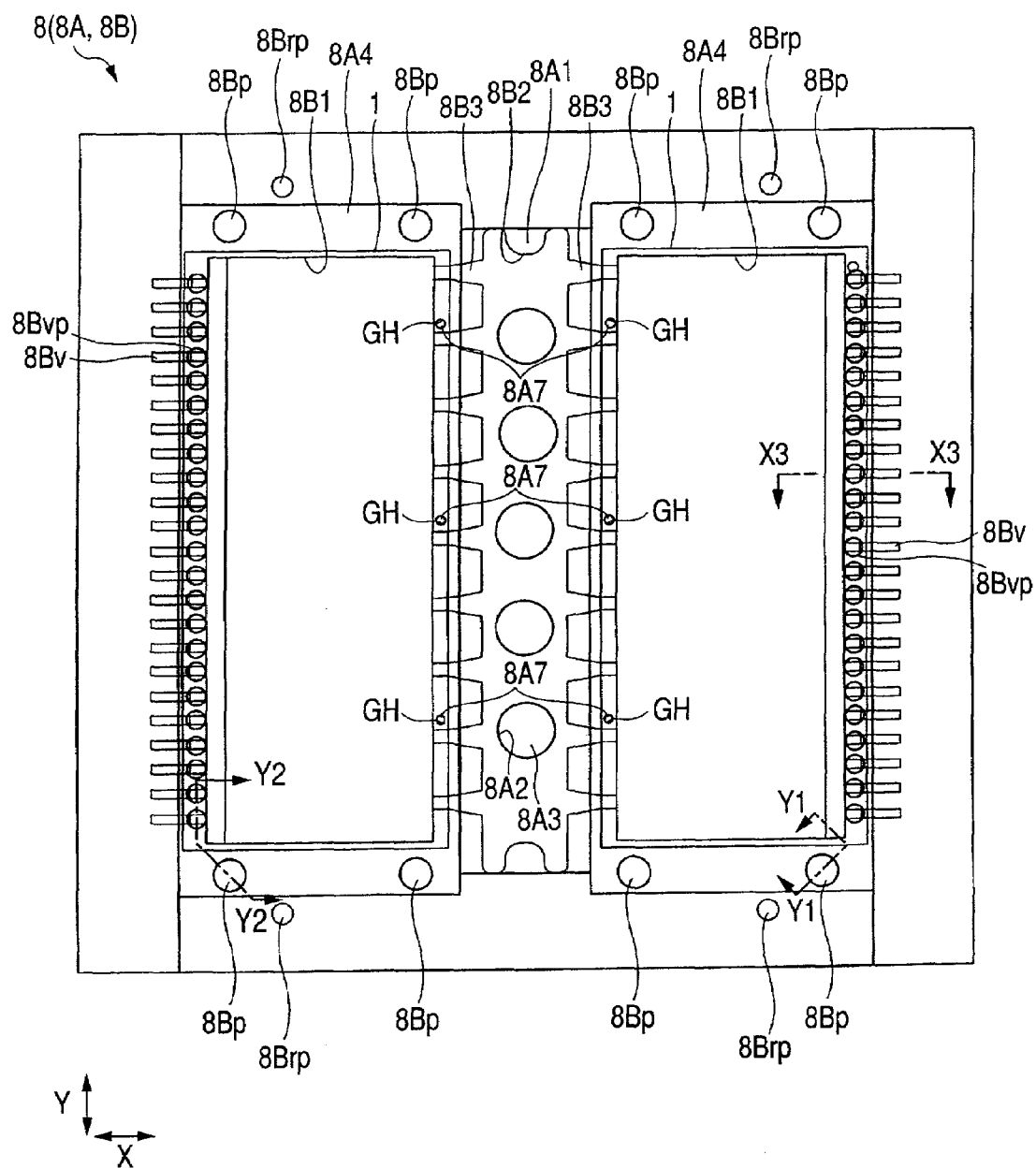
FIG. 30 is a plan view of the molding die used in the semiconductor device manufacturing process embodying the present invention, showing in what state the wiring substrate matrices are held in the molding die.

First, as described above, the substrate matrix 1 is placed with high alignment accuracy onto each lower die cavity block 8A4 of the molding die 8, and, thereafter, the upper die 8B is brought down to hold the substrate matrix 1 so that it is sandwiched between the lower die 8A and the upper die 8B. FIG. 30 is a plan view which shows this state as seen through the upper die 8B to make it easier to see the state of the substrate matrix 1 and that of the lower die 8A. In this state, the portion of the substrate matrix 1 on which a clamping force is exerted is an annular region of about 1 mm width of the outer peripheral portion of the cavity 8B1.

For example, if the substrate matrix 1 is in a rectangular shape of 151 mm×66 mm, the area exclusive of air vents and gate portions, under the conditions of 148 mm×60 mm, 0.8 mm wide, corresponds to a region of about 1000 mm$^2$.

Figure 31:
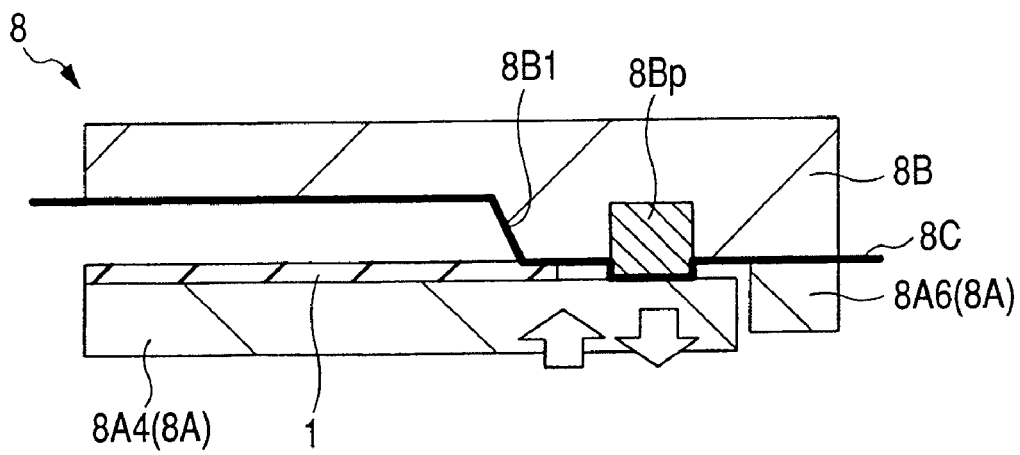
FIG. 31 is a sectional view taken along line Y1-Y1 in FIG. 30.

FIG. 31 is a sectional view taken on line Y1-Y1 in FIG. 30, showing a portion related to each block pin 8Bp in a clamped state of the substrate matrix 1. In the molding step according to this first embodiment, as described above, when the upper die 8B is brought down after placing the substrate matrices 1 onto the lower die cavity blocks 8A4 of the lower die 8A, the outer peripheral portions of the cavities 8B1 in the upper die 8B comes into abutment against the outer peripheral portions of the main surfaces (parts mounting surfaces) of the substrate matrices 1, causing the substrate matrices 1 to be deformed sufficiently to the extent of preventing resin leakage, and, thereafter, the block pins 8Bp of the upper die 8Bp push down the lower die cavity blocks 8A4. By so doing, when clamping the substrate matrices 1 by both the upper die 8B and the lower die 8A, it is possible to suppress or prevent the application of an excessive pressure to the substrate matrices 1, and, hence, it is possible to suppress or prevent deformation or cracking caused by crushing of the substrate matrices 1. Consequently, it becomes possible to improve the semiconductor device manufacturing yield. For example, when a load of 490 MPa (500 kg/cm$^2$) is applied to each substrate matrix 1 when clamping the substrate matrix, a load of about 421 MPa (430 kg/cm$^2$) is absorbed by the block pins 8Bp, and the load imposed on the outer periphery portion of the substrate matrix 1 which is pushed down by the upper die 8B can be made 68.6 MPa (70 kg/cm$^2$) or so.

That is, the pressure of the portion where the molding surface of the upper die 8B is abutted against each substrate matrix 1 is smaller than the pressure of the portions of block pins 8Bp. Therefore, the elastic force of the elastic members 8A5 which underlie the lower die cavity block 8A4 need not be lowered, so that the problem of resin leakage onto the main surface of the substrate matrix 1 in the molding step does not occur. When the type of the substrate matrix 1 changes and a great change in thickness results, a countermeasure may be effected by replacing the block pins 8Bp with one having a projection length D which can cope with such a change. Since the molding step being considered uses the laminate film 8C, the upper die 8B pushes the outer peripheral portion of each substrate matrix 1 through the laminate film C, and the block pins 8Bp push down the lower die cavity block 8A4 through the laminate film 8C.

Figure 32:
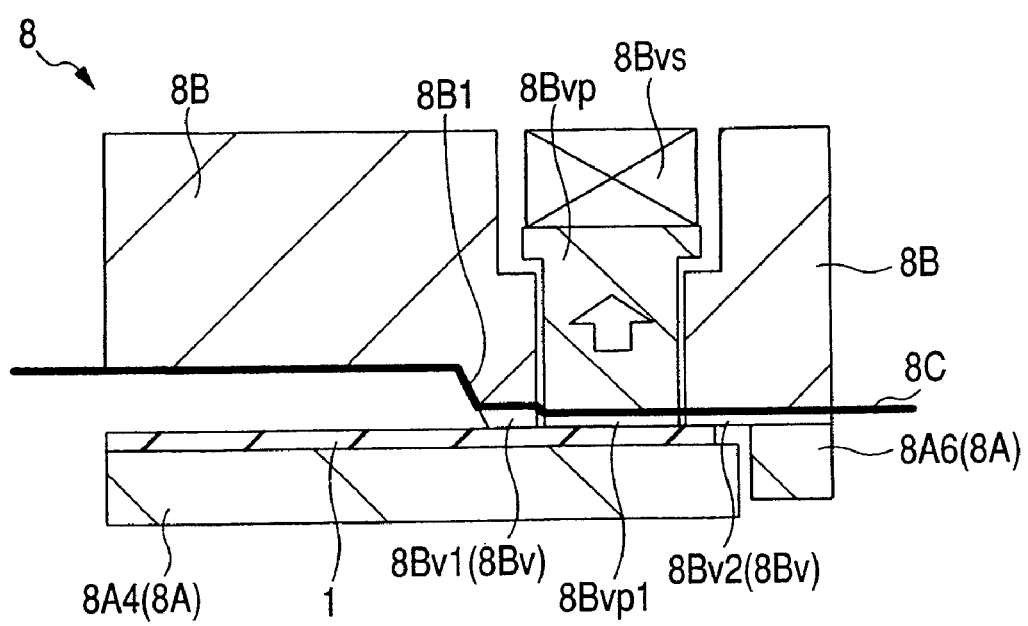
FIG. 32 is a sectional view taken along line X3-X3 in FIG. 30.
Figure 33:
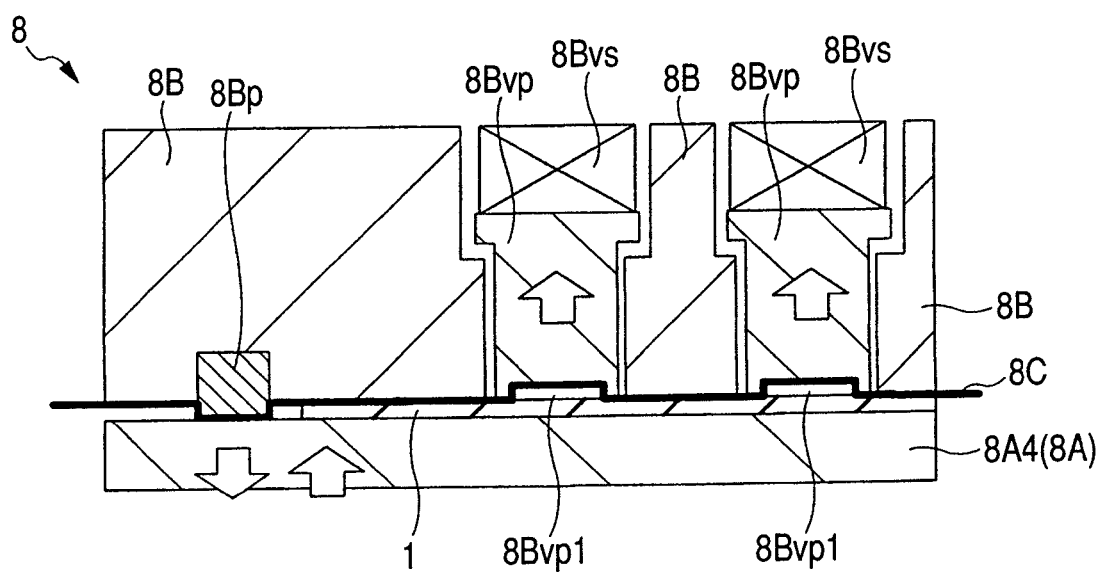
FIG. 33 is a sectional view taken along line Y2-Y2 in FIG. 30.

FIG. 32 is a sectional view taken on line X3-X3 in FIG. 30, and FIG. 33 is a sectional view taken on line Y2-Y2 in FIG. 30, each showing a portion related to each air vent 8Bv at the time of clamping each substrate matrix 1. In the molding step according to this first embodiment, when the substrate matrices 1 are clamped by both the upper die 8B and the lower die 8A, each movable pin 8Bvp projecting to the associated air vent 8Bv side is pushed from the associated substrate matrix 1 side and moves upward. As a result, the air vent 8Bv can be constituted by the movable pin front portion 8Bv1, the groove 8Bvp1 and the movable pin rear portion 8Bv2 and it is possible to ensure a flow path for sending out the air present in the resin-filled portion (cavity 8B1) to the exterior (a flow path of air vent 8Bv can be ensured although the laminate film 8C is used), so that molten resin for sealing can be injected smoothly into the cavity 8B1. On the other hand, with the elastic force of the elastic member 8Bvs which overlies the movable pin 8Bvp, the movable pin 8Bvp presses down the main surface of the substrate matrix 1 moderately. Consequently, the problem of resin leakage onto the main surface of the substrate matrix 1 in the region of the air vent 8Bv does not occur.

Figure 34:
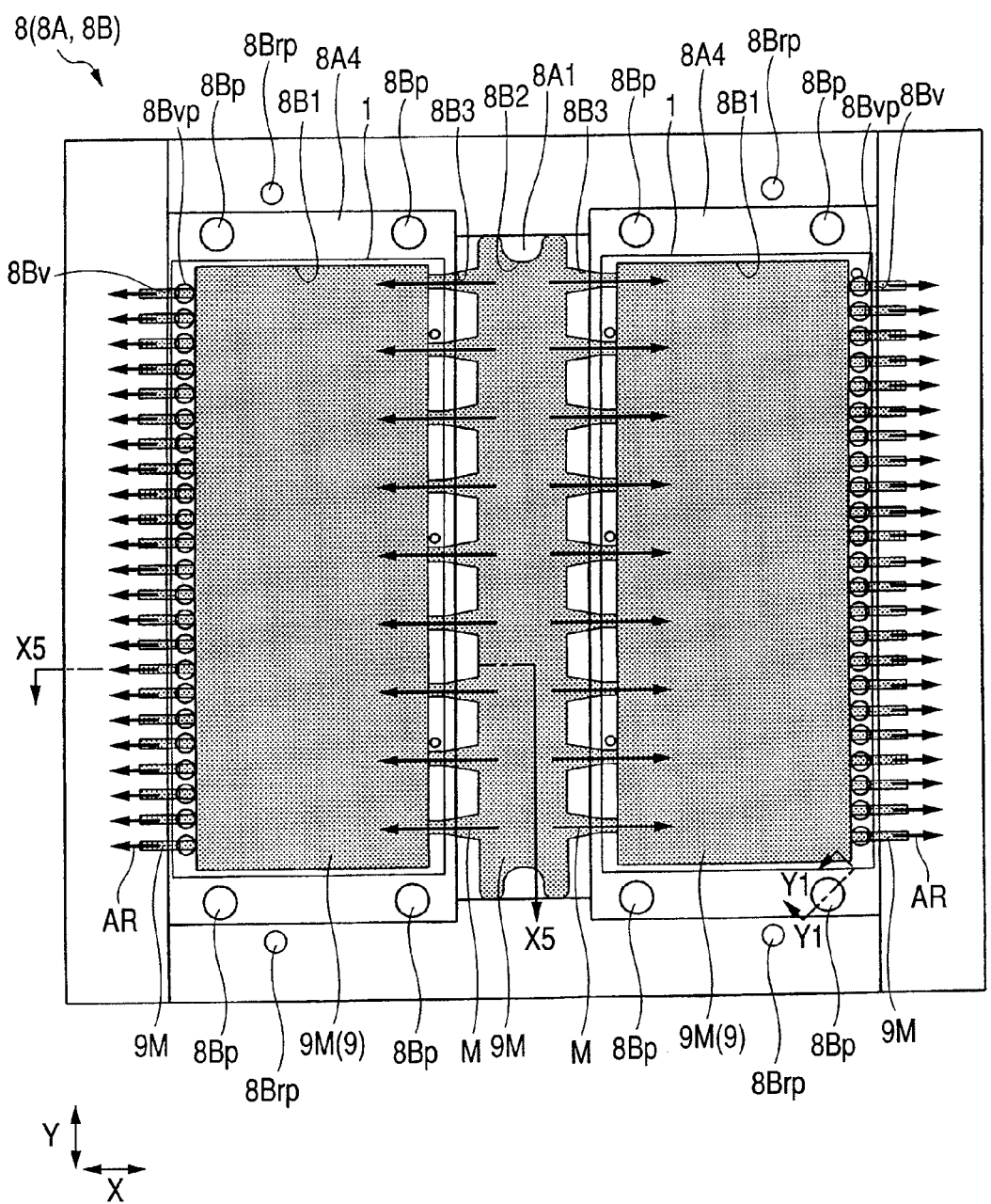
FIG. 34 is a plan view of the molding die used in the semiconductor device manufacturing process embodying the present invention, showing in what state molten resin is injected into cavities after holding the wiring substrate matrices in the molding die.
Figure 35:
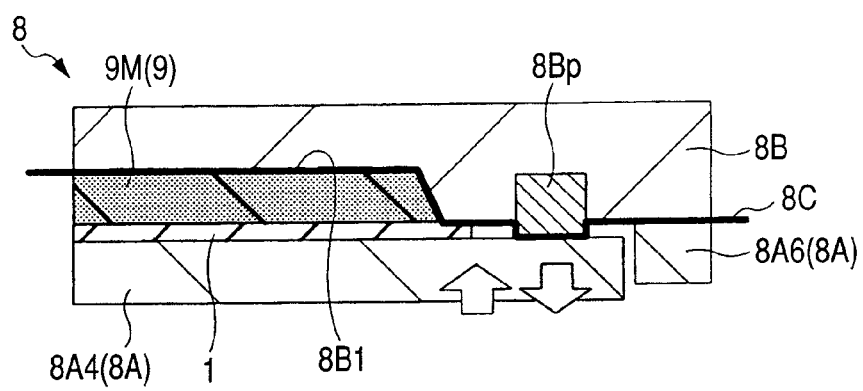
FIG. 35 is a sectional view taken on line Y1-Y1 in FIG. 34.
Figure 36:
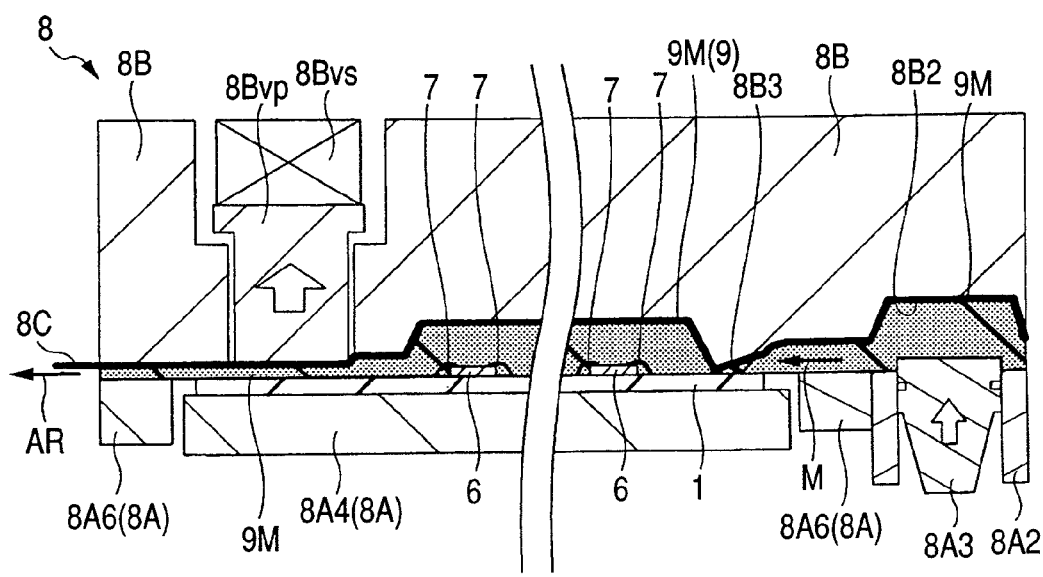
FIG. 36 is a sectional view taken on line X5-X5 in FIG. 34.

Next, after holding the substrate matrix 1 in the above manner, molten resin 9M in the pots 8A2 is extruded into the groove 8B2 with the plungers 8A3 and is injected into each cavity 8B1 through the gates 8B3. FIG. 34 is a plan view showing this state, in which the interior is seen through the upper die 8B to make the state of the substrate matrices 1 and that of the lower die 8A easier to see. Arrow M represents the flow of molten resin 9M and arrow AR represents the flow of air in the cavities 8B1. As noted above, since the outer peripheral portion of the main surface of each substrate matrix 1 is pressed down by the upper die 8B with an appropriate pressure, excessive crushing or cracking does not occur, nor does the leakage of resin occur, and the molten resin 9M for sealing can be injected into each cavity 8B1. FIG. 36 is a sectional view taken on line X5-X5 in FIG. 34, showing the state of a portion related to each air vent 8Bv at the time of resin injection. Also in this case, since the air vents 8Bv can be ensured in a satisfactory manner as described above, the air present in the resin-filled portions (8B1) can be discharged to the exterior, and, hence, the molten resin 9M for sealing can be injected smoothly into the cavities 8B1. As a result, the percent occurrence of a poor appearance of the block sealing member 9 caused by the molding die 8 can be decreased, and, therefore, the appearance inspection can be simplified. In FIGS. 34 to 36, the molten resin 9M is hatched to make the figures easier to see.

It is preferable for each air vent 8Bv to be of a shape having a sufficient height or width so as to minimize the amount of resin leaking from the air vent 8Bv to the exterior after the injection of resin into each cavity 8B1. For example, if the height of each air vent 8Bv is set in accordance with the particle diameter of a filler contained in the resin, it is possible to control the amount of resin leaking out from the air vent 8Bv. As an example, if the height of each air vent 8Bv is set at a value of not larger than twice the maximum particle diameter of the filler contained in the resin, more preferably, if it is set at a value of not larger than the maximum particle diameter of the filler, the amount of resin leaking out from each air vent 8Bv can be suppressed to a satisfactory extent.

Second Embodiment

This second embodiment will be directed to an example of a method of changing the clamping pressure (holding pressure) for the substrate matrices in the molding die in accordance with the thickness of the substrate matrices. Since the substrate matrices 1 and the molding die 8 used in this second embodiment are the same as in the first embodiment, the following description will be provided with reference to the drawings which have been referred to in conjunction with the first embodiment.

Figure 37:
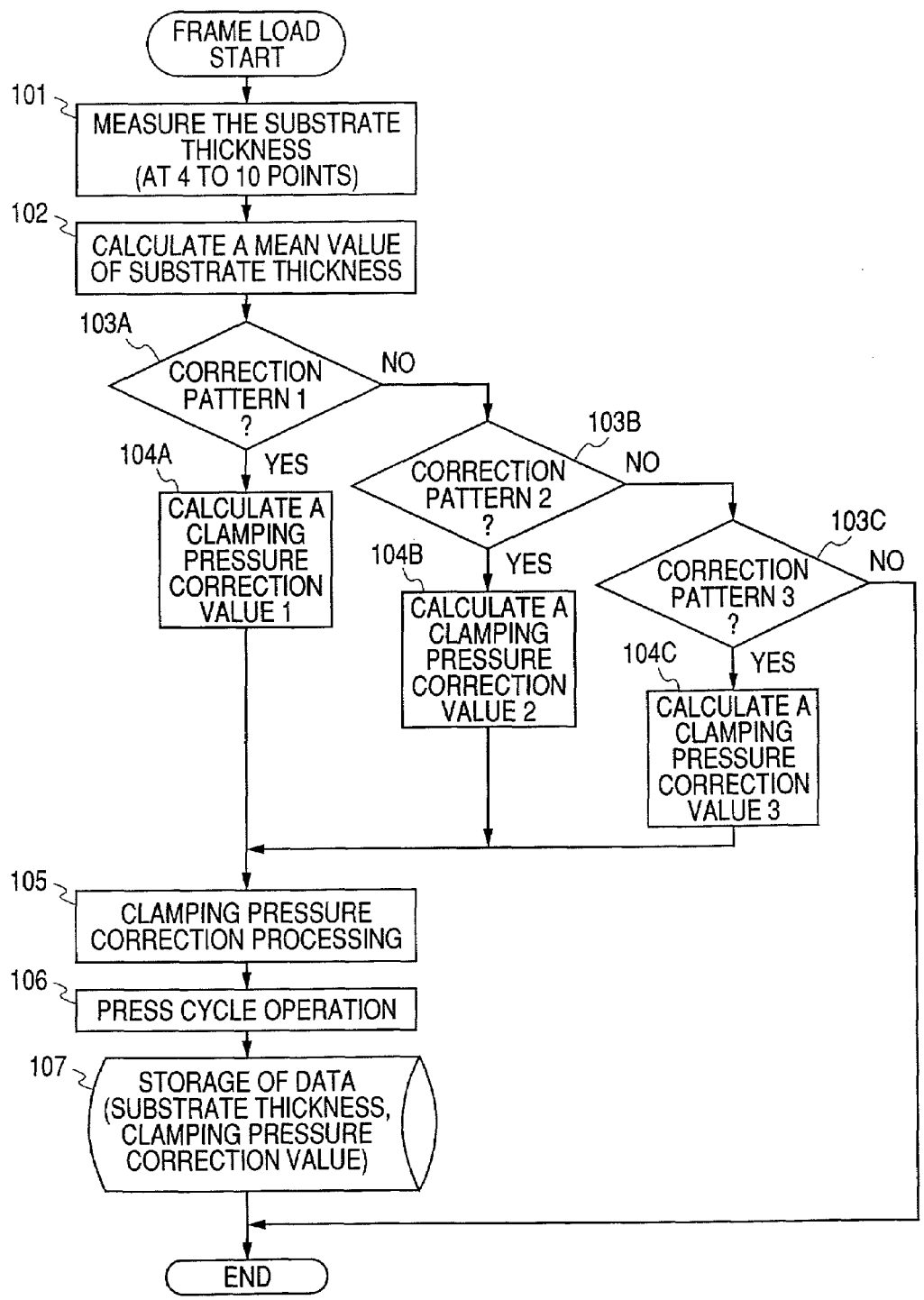
FIG. 37 is a sequence diagram showing a process for setting a clamp pressure of a molding die for a wiring substrate matrix in a semiconductor device molding step according to another embodiment of the present invention.

FIG. 37 shows an example of a sequence for setting a clamping pressure of the molding die for the substrate matrices 1 in a molding step according to this second embodiment.

First, before accommodating each substrate matrix 1 into the molding die 8, the actual thickness of the substrate matrix 1 to be subjected to resin molding is measured (step 101). In this measurement of the thickness, for example, in the substrate loader 23, substrate arraying section 24, or load conveyance section 25*a*, shown in FIG. 15, the thickness of the substrate matrix 1 is measured mechanically or optically at four to ten positions of the main surface of the substrate matrix. Subsequently, a mean value of the matrix thickness is calculated from the results of the above measurement (step 102).

Subsequently, with reference to the calculated thickness value of the substrate matrix 1, correcting change proportions and correctable values are preset as plural kinds of correction patterns with respect to the present clamp pressure in the molding die 8. The thickness calculated value of the substrate matrix 1 is compared with various correction values, and a study is made as to whether there is a correction pattern best suited to the calculated thickness value of the substrate matrix 1. In the process flow of FIG. 37, a check is made to see if correction pattern 1 is an optimum pattern or not (step 103A), and if the answer is affirmative, a clamp pressure correction value is calculated (step 104A). On the other hand, if the answer is negative, a check is made to see if correction pattern 2 is an optimum pattern or not (step 103B), and if the answer is affirmative, a clamp pressure correction value is calculated (step 104B). On the other hand, if the answer is negative, a check is made to see if correction pattern 3 is an optimum pattern or not (step 103C), and if the answer is affirmative, a clamp pressure correction value is calculated (step 104C). On the other hand, if the answer is negative, since there is no calculated value of substrate data within the range of correctable values, it is assumed that the substrate thickness is outside the range capable of being covered by the molding die, that is, the substrate matrix is assumed to be an off-specification substrate matrix, and the substrate matrix is regarded as being defective and the process flow is ended.

After the clamp pressure correction value is calculated, the clamp pressure of the lower die 8A of the molding die 8 is corrected (step 105) and a shift is made to an actual press cycle operation of the molding die 8 (step 106). At this time, data of the clamp pressure correction value best suited to the substrate matrix 1 is stored (step 107). The stored data can be utilized effectively in the subsequent molding step.

Thus, in this second embodiment, the clamping pressure for the substrate matrix 1 in the molding die 8 can be set to an optimum value in accordance with the thickness of each substrate matrix 1. For example, if the measured thickness value of the substrate matrix 1 is larger than a predetermined value, the clamping pressure is decreased automatically, while if the measured thickness value is smaller than the predetermined value, the clamping pressure is increased automatically, whereby the molding step can be allowed to proceed while making a correction so that the clamping pressure applied to the substrate matrix 1 becomes almost constant, that is, the amount of the substrate matrix 1 crushed by the upper die 8B becomes almost constant. Thus, it is possible to let the molding step proceed without cracking or deformation of the substrate matrix 1 or without resin leakage, so that it is possible to improve the semiconductor device manufacturing yield. Moreover, in comparison with the case where it is required to stop the operation of the automatic molding system and change various setting values at every occurrence of cracking, deformation or resin leakage in the molding step, this second embodiment permits an optimum clamping pressure in the molding die 8 to be set automatically for each substrate matrix 1. Consequently, the molding step can be allowed to proceed smoothly without the occurrence of cracking, deformation or resin leakage caused by a change in thickness of the substrate matrix 1, and, hence, it is possible to shorten the time required for manufacturing the semiconductor device.

Although the present invention has been described with reference to various embodiments thereof, it goes without saying that the present invention is not limited to the above-described embodiments, but that various changes may be made within a scope not departing from the gist of the invention.

For example, although in the above-described first and second embodiments the block pins 8Bp are provided on the upper die 8B side, the invention is not limited thereto. The block pins 8Bp may be provided on the lower die 8A side in the same manner as is the case with the provision thereof on the upper die side.

Although in the above-described first and second embodiments the movable pins 8Bvp of the upper die 8B are provided for each air vent 8Bv, the invention is not limited thereto, but a construction may be adopted wherein one movable pin 8Bvp is allocated to plural air vents 8Bv.

Although in the above-described first and second embodiments, a description has been given of a case where substrates having a multi-layer wiring structure, such as substrate matrices, are flowing along a semiconductor device manufacturing line, the invention is not limited thereto, but the present invention is also applicable to the case where lead frames are flowing as substrates to be subjected to resin molding.

Although in the above-described first and second embodiments, a description has been given of a molding step using a laminate film, the invention is not limited thereto, but the present invention is also applicable to a molding step not using a laminate film.

Although in the above-described second embodiment, the thickness of each substrate matrix 1 is measured by use of an automatic molding system, the invention is not limited thereto, but the thickness of each substrate matrix 1 may be measured, for example, before the mounting of chips 6, or after the mounting of chips 6 and before the wire bonding step, or after the wire bonding step and before loading into the automatic molding system.

Further, although the above description is concerned with a case where the present invention is applied to a method of manufacture of a CSP type semiconductor device as a background utilization field, the invention is not limited thereto, but the present invention is also applicable to various other semiconductor devices. For example, the present invention is also applicable to the manufacture of other package type semiconductor devices, such as BGA (Ball Grid Array) and LGA (Land Grid Array).

The present invention is generally applicable to the semiconductor device manufacturing industry.

What is claimed is:

1. A method of manufacturing a semiconductor device, comprising the steps of:
   (a) providing a substrate constituting a multi-layer wiring substrate, the multi-layer wiring substrate having a stacked structure of resin and metallic foil;
   (b) mounting a semiconductor chip over the substrate;
   (c) providing a molding die constituting a first die and a second die opposite to the first die, the second die having a cavity on a surface of the second die opposite to the molding surface of the first die, the second die having an air vent formed around the cavity, the second die having a through hole reaching to the air vent and a movable pin arranged in the through hole, the movable pin having a concaved portion formed in a surface of the movable pin opposite to the molding surface of the first die;
   (d) placing the substrate with the semiconductor chip mounted thereover over the molding surface of the molding die, for resin molding;
   (e) clamping the substrate so as to be sandwiched by both the first die and the second die of the molding die; and
   (f) injecting a sealing resin into a cavity of the molding die,
   wherein in the step (e), the first die is pushed down by a projecting portion formed in a molding surface of either the first die or the second die after contacting of the molding surface of the second die of the molding die against the substrate,
   wherein before clamping the substrate by the molding die, the movable pin is projected into the air vent, and
   wherein after clamping the substrate by the molding die, the movable pin is moved into the through hole.

2. The method according to claim 1, wherein the movable pin is able to operate in a direction intersecting the molding surface through an elastic member,
   wherein in the step (e), when the multi-layer wiring substrate is held so as to be sandwiched by both the first die and the second die, the movable pin is pushed by the multi-layer wiring substrate and in turn pushes the multi-layer wiring substrate by virtue of a repulsive force of the elastic member, and
   wherein in the step (f), air present within the cavity is allowed to escape to the exterior of the cavity through the air vent and the concaved portion.

3. The method according to claim 2, wherein the elastic member is comprised of a coiled spring or a plate spring.

* * * * *